(12) United States Patent
Henry

(10) Patent No.: US 11,790,034 B2
(45) Date of Patent: Oct. 17, 2023

(54) METHOD AND SYSTEM FOR TRACKING SINUSOIDAL WAVE PARAMETERS FROM A RECEIVED SIGNAL THAT INCLUDES NOISE

(71) Applicant: Oxford University Innovation Limited, Oxford (GB)

(72) Inventor: Manus Patrick Henry, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 452 days.

(21) Appl. No.: 16/349,501

(22) PCT Filed: Nov. 10, 2017

(86) PCT No.: PCT/EP2017/078970
§ 371 (c)(1),
(2) Date: May 13, 2019

(87) PCT Pub. No.: WO2018/087344
PCT Pub. Date: May 17, 2018

(65) Prior Publication Data
US 2019/0294649 A1  Sep. 26, 2019

(30) Foreign Application Priority Data

Nov. 11, 2016 (GB) ...................... 1619086

(51) Int. Cl.
*G01F 1/66* (2022.01)
*G06F 17/14* (2006.01)
(Continued)

(52) U.S. Cl.
CPC .............. *G06F 17/141* (2013.01); *G01F 1/66* (2013.01); *G01F 1/8431* (2013.01); *G01F 1/8436* (2013.01); *H03H 17/0201* (2013.01)

(58) Field of Classification Search
CPC ........ G06F 17/141; G06F 17/14; G06F 17/10; G06F 17/00; G01F 1/8436; G01F 1/78;
(Continued)

(56) References Cited

U.S. PATENT DOCUMENTS

| | | | | |
|---|---|---|---|---|
| 4,972,358 A | * | 11/1990 | Welles, II | ............. G06F 17/142 708/405 |
| 7,020,218 B2 | * | 3/2006 | Arnesen | ............. H04L 27/2653 375/316 |
| 8,868,379 B2 | * | 10/2014 | Okada | ................ G01B 9/02003 702/191 |

OTHER PUBLICATIONS

Dutka, Jacques, "Richardson Extrapolation and Romberg Integration," Historia Mathematica, 1984, pp. 3-21, vol. 11.
(Continued)

*Primary Examiner* — Mohamed Charioui
(74) *Attorney, Agent, or Firm* — Thomas|Horstemeyer, LLP

(57) ABSTRACT

A system for tracking selected wave parameters from a received sinusoidal wave with noise and methods for making and using the same. The method includes performing a multi-track double integral analysis of the sinusoidal wave with noise and creating time dependent outputs. These time dependent outputs may be analyzed mathematically to determine the amplitude, frequency and/or phase of the wave with reduced noise. In one embodiment, the method may employ multiple passes through double integral analysis. The method advantageously can measure output sinusoidal wave parameters with reduced noise, measurements that are close to theoretical noise reduction limits.

19 Claims, 24 Drawing Sheets

130

(51) Int. Cl.
*H03H 17/02* (2006.01)
*G01F 1/84* (2006.01)

(58) Field of Classification Search
CPC . G01F 1/76; G01F 1/00; G01F 1/8431; G01F 1/66; H03H 17/0201; H03H 17/02; H03H 17/00
See application file for complete search history.

(56) References Cited

OTHER PUBLICATIONS

Bushev, Oleg Yu. and Olga L. Ibryaeva, "Choosing an Optimal Sampling Rate to Improve the Performance of Signal Analysis by Prony's Method," 2012, pp. 634-638.
Henry, Manus, et al., "Prism Signal Processing for Sensor Condition Monitoring," pp. 1404-1411.
Leach, Felix, et al., "Fast Coriolis mass flow metering for monitoring diesel fuel injection," Flow Measurement and Instrumentation, 2017, pp. 1-5.
Henry, M.P., "3rd international conference on microfluidic handling systems prism signal processing: A recursive fir technique applied to the efficient tracking of resonant sensor systems," Oral Presentation, 2014, pp. 98-101, Enschede, The Netherlands.
Henry, Manus, et al., "The Prism: Efficient Signal Processing for the Internet of Things," IEEE Industrial Electrical Magazine, 2017, pp. 22-32, vol. 11, No. 4, doi: 10.1109/MIE.2017.2760108.
Henry, Manus, et al., "The Prism—Efficient signal processing for IoT applications," IEEE Industrial Electronics Magazine, 2017, pp. 1-21.
Henry, Manus, "An Introduction to Prism Signal Processing Applied to Sensor Validation," pp. 1-13.
Henry, Manus, "An Introduction to Prism Signal Processing," Flow Measurement Institute Conference, 2017, pp. 1-2, Flow Measurement Institute, Coventry University, UK.
Henry, Manus, "Prism Signal Processing for Dual Mode Coriolis Flow Metering," Flow Measurement Institute Conference, 2017, pp. 1-2, Flow Measurement Institute, Coventry University, UK.
Henry, Manus, "Prism Signal Processing for Diesel Engine Fuel Injection Monitoring," Flow Measurement Institute Conference, 2017, pp. 1-2, Flow Measurement Institute, Coventry University, UK.
International Search Report & Written Opinion for WO2018/087344 (PCT/EP2018/078970), dated Dec. 21, 2018, pp. 1-11.
International Preliminary Report on Patentability for WO2018/087344 (PCT/EP2018/078970), dated May 14, 2019, pp. 1-8.

\* cited by examiner

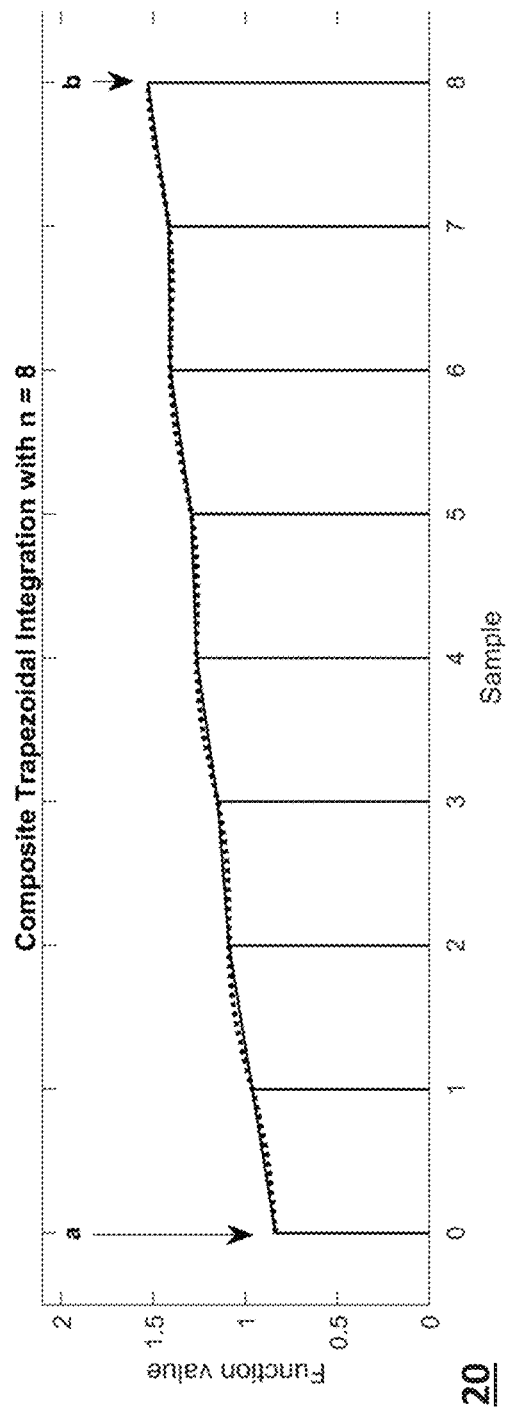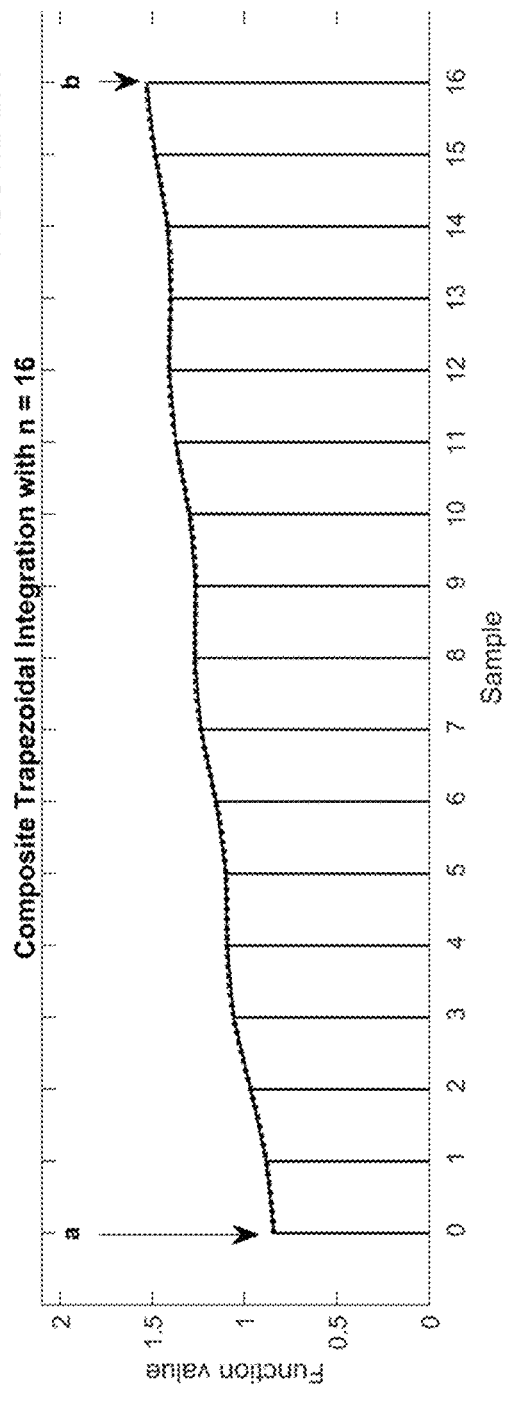

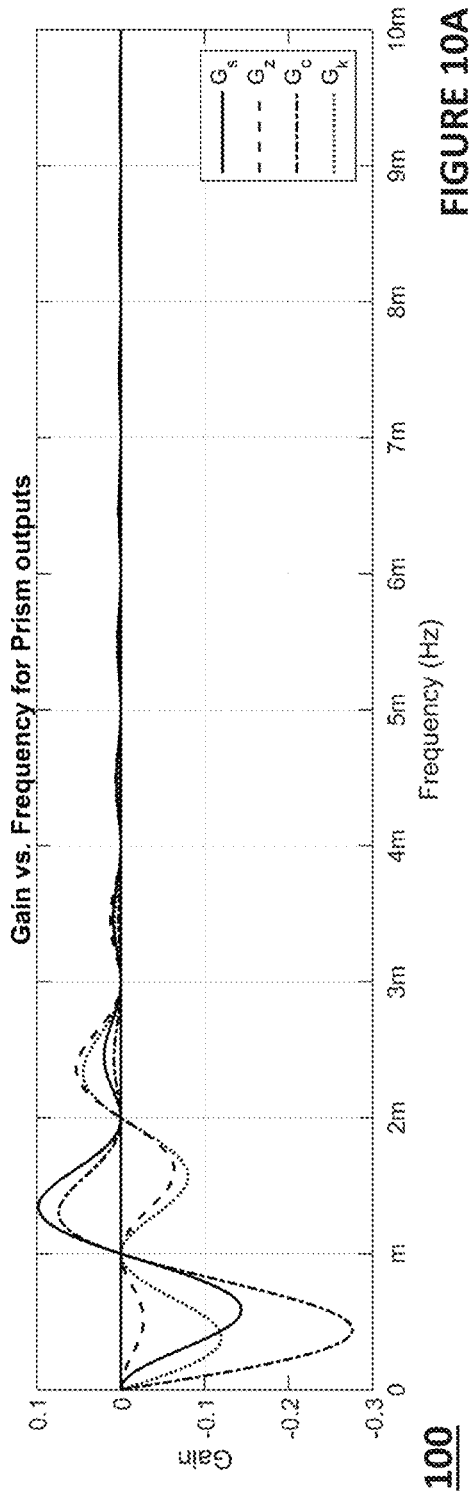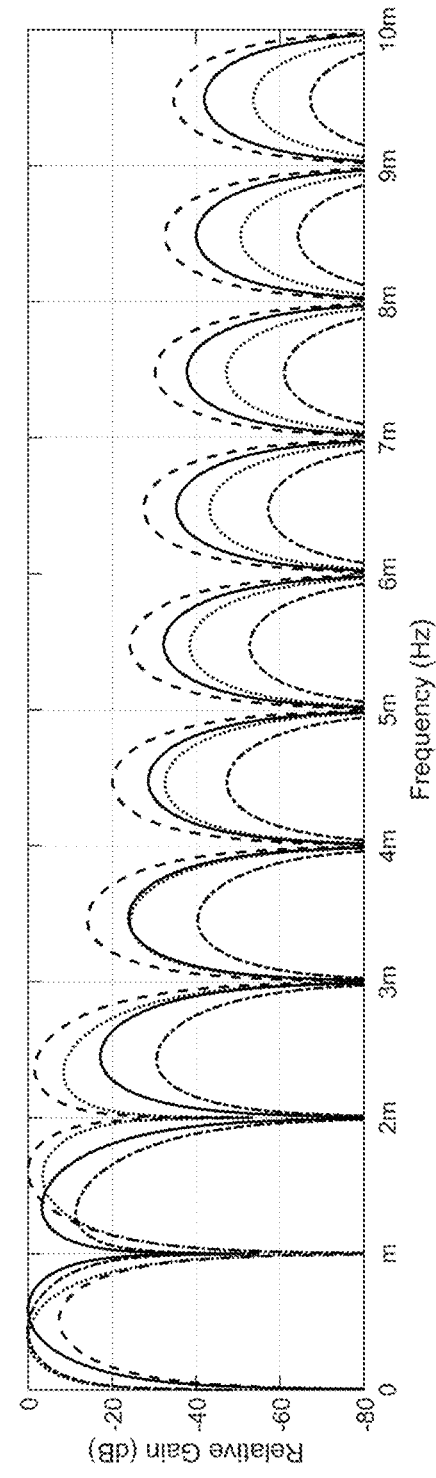
FIGURE 10A
FIGURE 10B

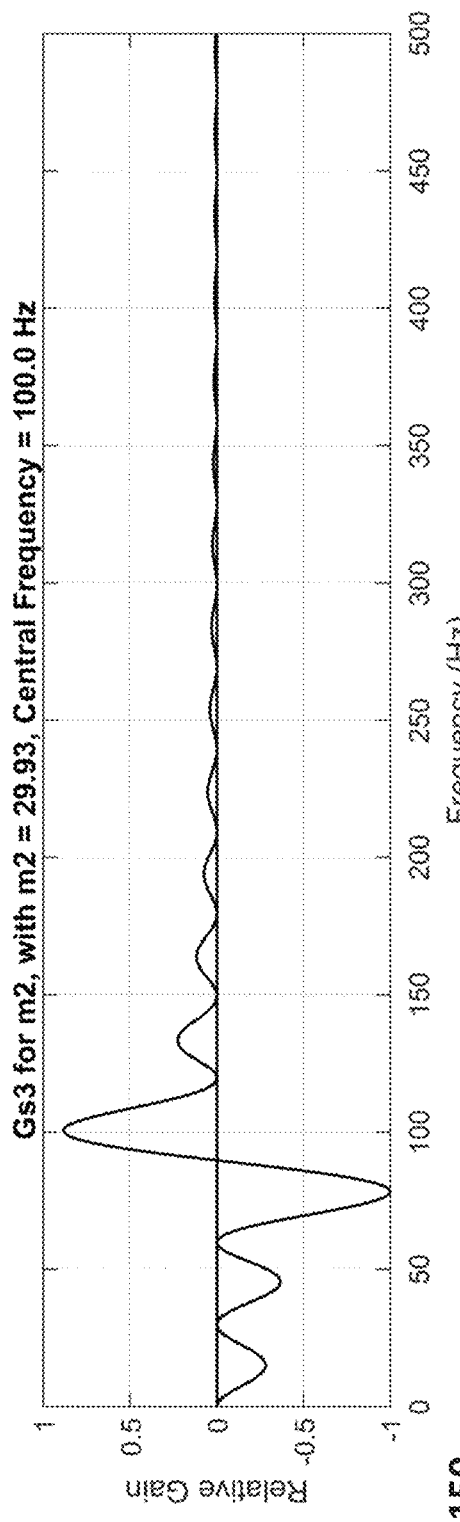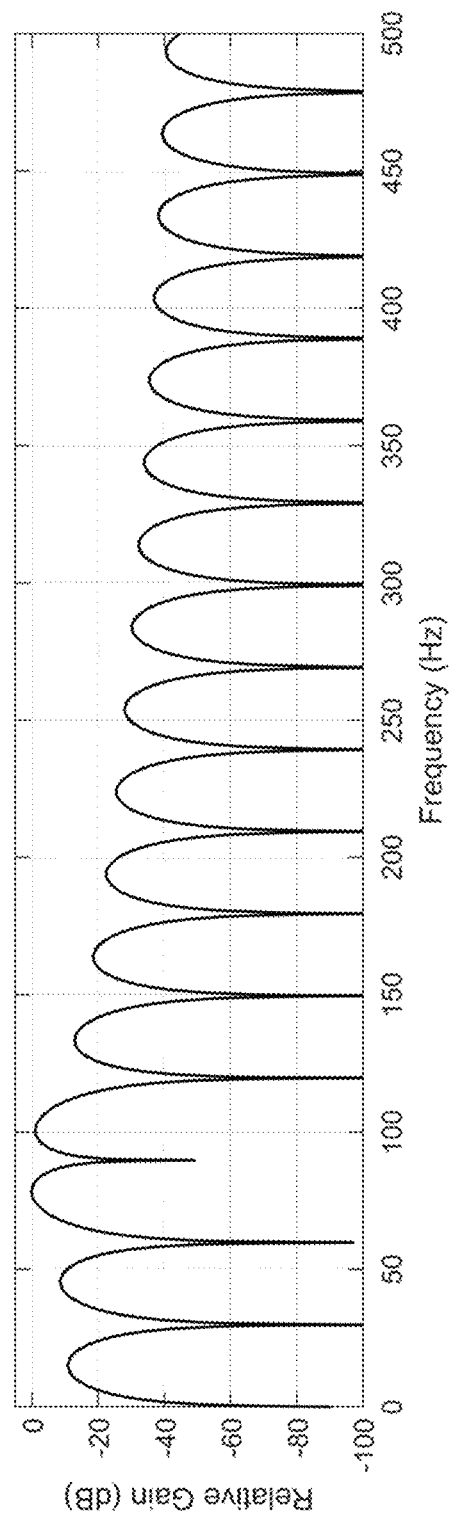
FIGURE 15A
FIGURE 15B

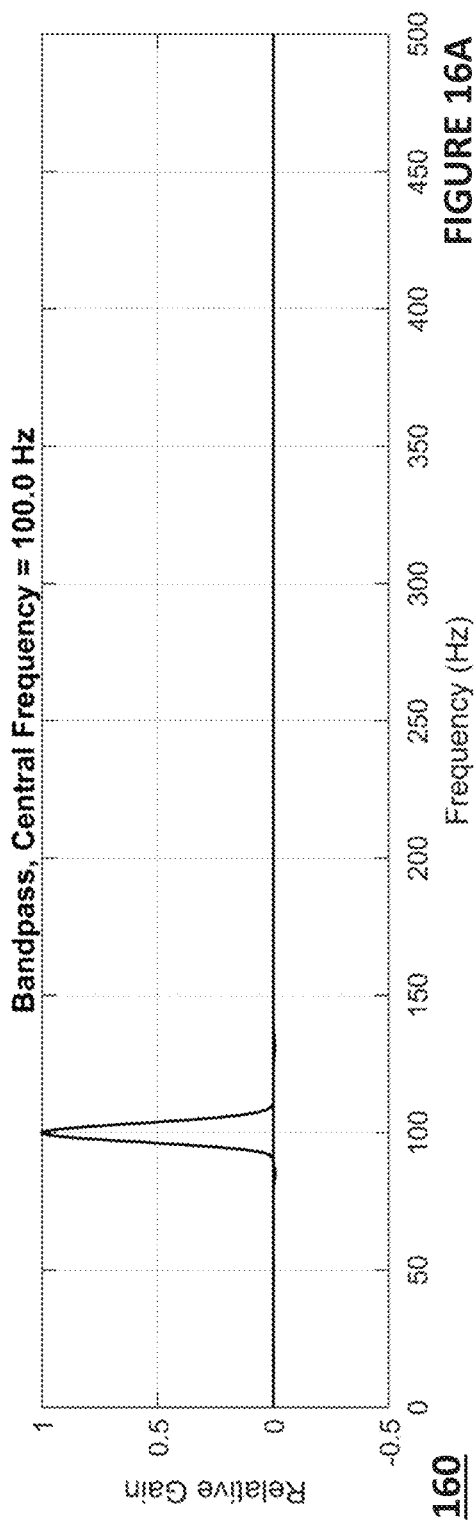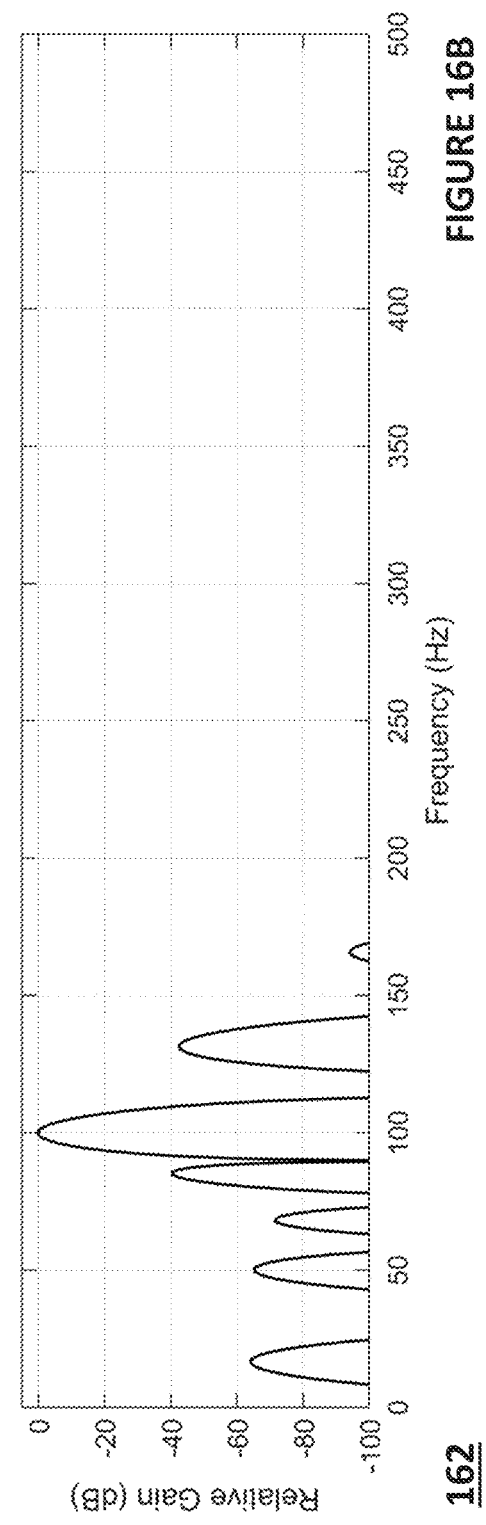

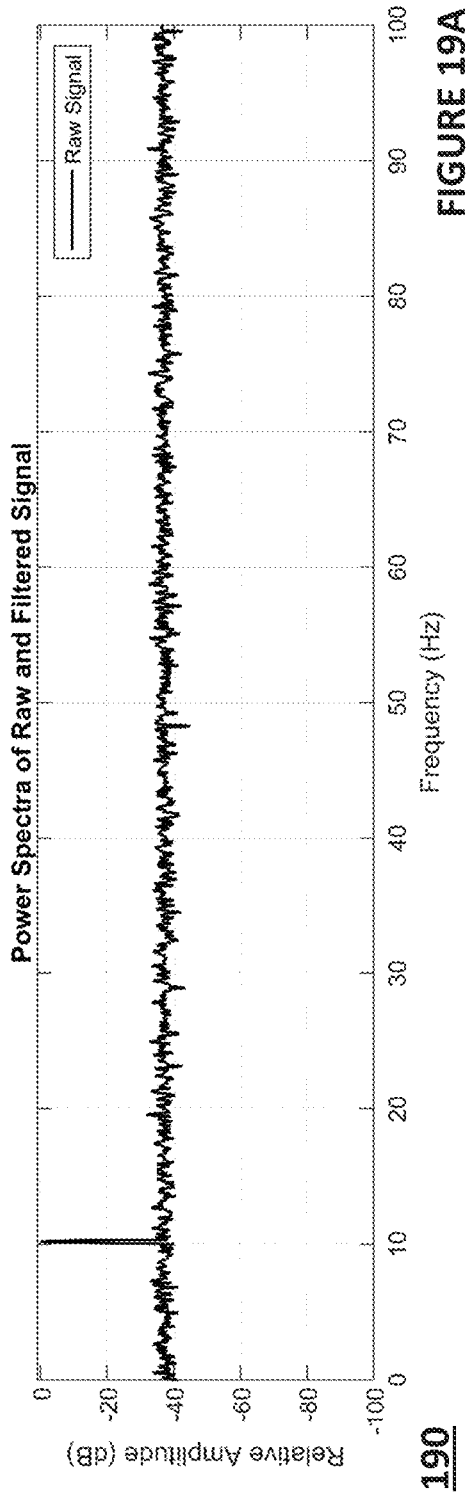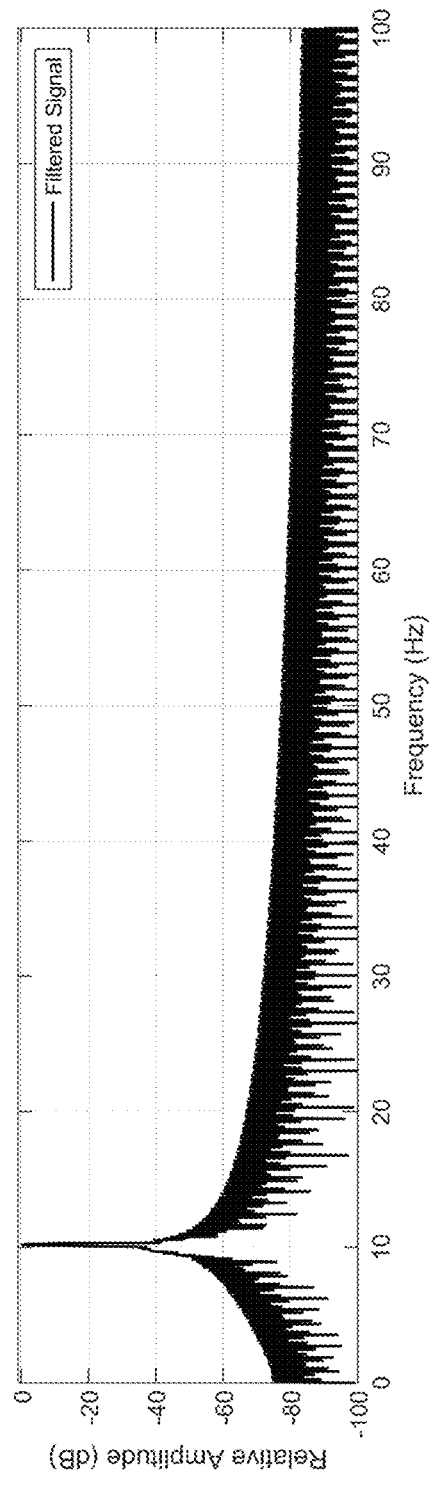

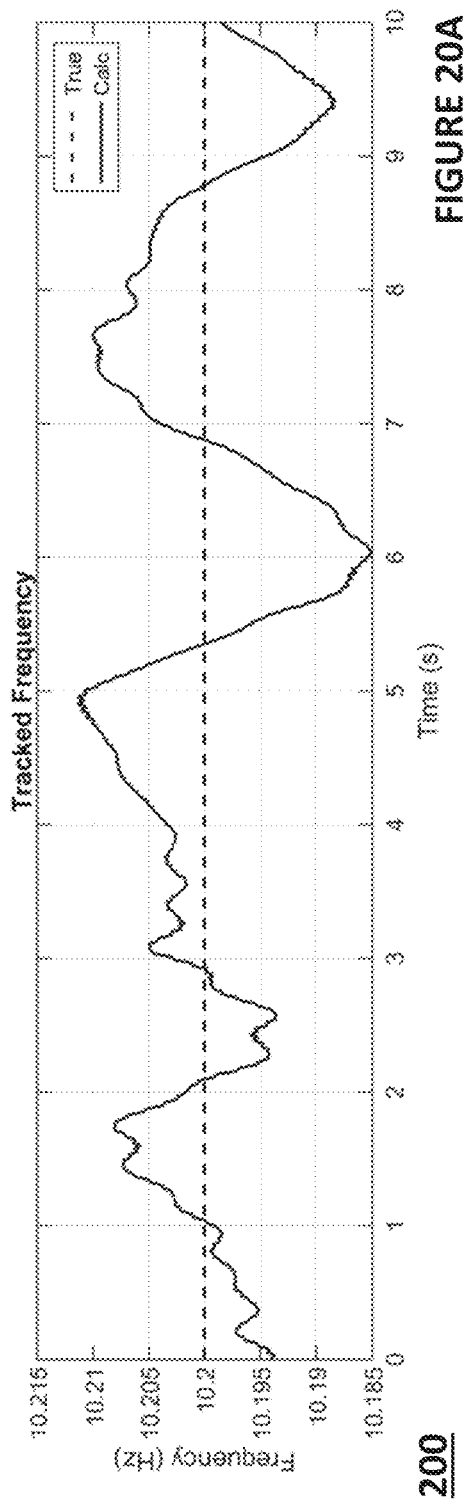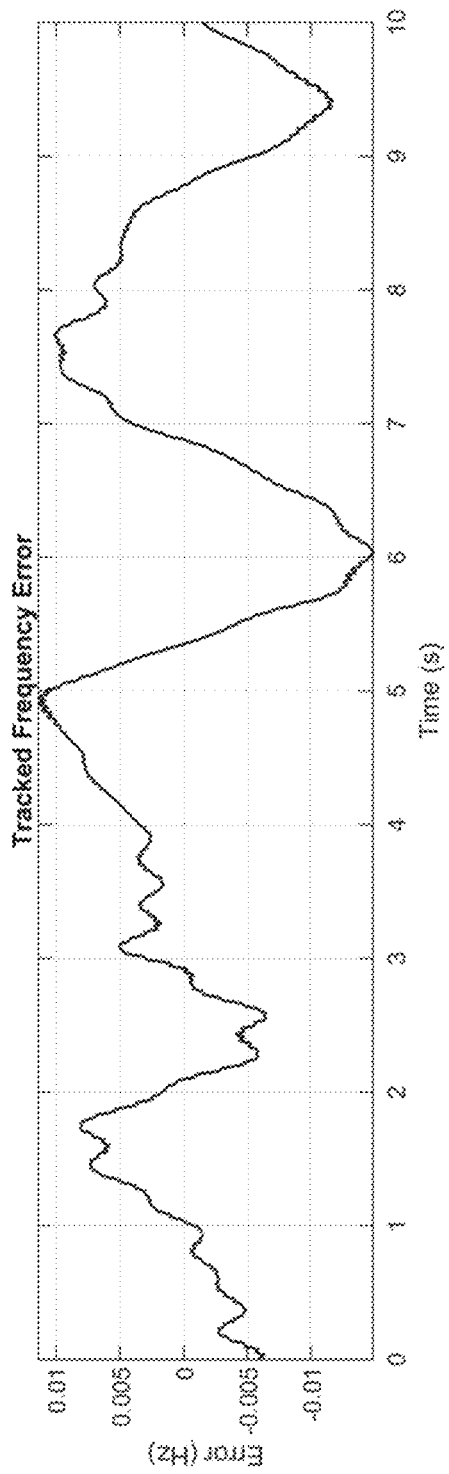
FIGURE 20A
FIGURE 20B

220

222

US 11,790,034 B2

METHOD AND SYSTEM FOR TRACKING SINUSOIDAL WAVE PARAMETERS FROM A RECEIVED SIGNAL THAT INCLUDES NOISE

CROSS-REFERENCE TO RELATED APPLICATIONS

This application is the National Stage of International Application No. PCT/EP2017/078970, filed Nov. 10, 2017, which claims the priority to GB 1619086.0, filed Nov. 11, 2016, which are entirely incorporated herein by reference.

FIELD

The disclosed embodiments relate generally to systems and methods for tracking sinusoidal wave parameters in the presence of noise.

BACKGROUND

As well understood by practitioners of the art, current methods and techniques for tracking sinusoids in noisy data have the following limitations. It is difficult to provide accurate performance, especially for short data windows and/or in the presence of high noise; it is difficult to provide stability with respect to noise and/or parameter changes; it is difficult to provide a fast dynamic response with respect to parameter changes; it is difficult to track multiple sinusoidal components simultaneously; and the computational load required for sinusoidal tracking is high. More generally, because of the various constraints associated with these performance aspects, the design of a sinusoidal tracking system suitable for a particular application is multi-facetted, complex, and requires high levels of skill.

With regard to the closely related task of filtering, current difficulties are also well understood by those familiar with the field. Infinite Impulse Response ("IIR") filters are generally computationally efficient, but typically offer non-linear phase and gain characteristics, and are subject to numerical instability. Finite Impulse Response ("FIR") filters can provide linear phase characteristics and are usually numerically stable, but generally require a high computational burden in order to deliver a given filtering performance, because they cannot in general use feedback to reuse previous computational effort. Filter design is complex and computationally expensive, and cannot generally be carried out in real-time within field devices, for example in order to adapt to the actual characteristics of the signal being filtered. Accordingly, it is difficult to ensure that filtering performance will be sufficient to facilitate accurate and/or computationally efficient sinusoid tracking, for example by ensuring that only one sinusoidal component is in the passband.

Finally, the demand for sinusoidal tracking will significantly increase as a result of the Internet of Things, where many more sensors will be deployed in different environments, and where the constraints of computational power, advanced knowledge of signal characteristics, design effort and expertise, and other factors, will be higher than heretofore.

In view of the foregoing, a need exists for improved systems and methods that overcome the aforementioned obstacles and deficiencies of currently available filtering and sinusoidal tracking techniques.

BRIEF SUMMARY

Key benefits of some of the methods and systems disclosed, hereafter referred to as a Prism, include:

1) A low pass FIR filter that uses a recursive sliding window technique, so that the computation burden is independent of the window length, with linear phase response and good numerical stability.
2) The design process for this FIR filter is simple, and can easily be carried out on-line with limited computational resources. Thus it is possible to create new filters to match the observed signal characteristics, for example as these change over time, or in response to an external request, even within a resource-limited field device.
3) It is straightforward to combine two or more FIR filters into a chain or network in order to match more sophisticated requirements, such as (static) notch filtering and band-pass filtering.
4) Generally, each filter can be extended to provide a second filter output, where the two outputs are general orthogonal (i.e. have a phase difference of $\pi/2$ radians).
5) A variety of sinusoid trackers can be constructed to calculate estimates of the frequency, phase and/or amplitude of the monitored signal, each using a Prism network and a detection calculation. The resulting calculations may be simple, have low computational cost, and have accuracy results close to the Cramèr-Rao lower bound, even for short window lengths and with low signal-to-noise ratio.
6) Overall, this set of disclosures describes a broad range of methods and strategies to provide simple, powerful, adaptive filtering and sinusoidal component tracking techniques suited for a wide range of applications from low power simple sensors deployed in the Internet of Things to sophisticated instruments and off-line signal analysis.

The disclosed embodiments relate to methods and systems for filtering signals and for detecting sinusoidal wave components in the presence of noise. Sinusoidal wave parameters include amplitude, frequency and phase.

Disclosed embodiments include a system and a method for filtering an original signal, comprising passing the original signal through two or more integration paths, each path including a sequence of two or more integration stage blocks, and calculating at least one final output signal, where the at least one final output signal is based on an arithmetical combination of the outputs of at least two integration paths. In these embodiments, the original signal, the final output signal and at least one intermediary signal comprise a sequence of samples, where a sample is a numerical value, and where consecutive samples represent the corresponding signal over consecutive fixed intervals of time. Additionally, each integration stage block accepts an input signal and generates an output signal, and in a sequence of integration stage blocks, the output signal of a first block in the sequence forms the input signal to the next block in the sequence.

Another disclosed method and disclosed system take the above wherein each integration stage block has a data window, with an associated length in samples, such that the data window contains a sequence of the most recent input samples received by the integration stage block, and whereby only those input samples which are contained within the data window may influence the value of the corresponding integration stage block output sample.

Other disclosed embodiments are a method and a system which take the above embodiments and further arrange that each integration stage block assigns to every newly received input sample a coefficient, whereby the sample value is multiplied by the coefficient to generate a corresponding product value, and wherein the product value associated with each input sample remains unchanged for as long as the input sample remains within the data window. For each newly received input sample, each integration stage block calculates a corresponding output sample by carrying out a numerical integration over the product values corresponding to the input samples in the data window.

Yet another disclosed method and a disclosed system take the above wherein the total number of coefficients used in each integration stage block corresponds to the length of its data window, irrespective of the length of the input sample sequence, and where the coefficients have generally different values. In a further disclosed method and a disclosed system, the coefficient assigned to the newest input sample is equal to that of the oldest sample in the data window. In another disclosed method and a disclosed system, all integration stage blocks have the same data window length.

Filter design is considerably simplified if basic mathematical functions are sufficient to calculate the filter coefficients. Accordingly, another disclosed method and a disclosed system take the above wherein the coefficients comprise linearly spaced sine values, while in a further disclosed method and a disclosed system the set of coefficients for each integration stage block corresponds to a whole number of sinusoid periods.

Particular utility is shown for a disclosed method and a disclosed system wherein the filter makes use of only two different sets of coefficients: either a first set of linearly spaced sinusoidal values ("sine coefficients"), or a second set ("cosine coefficients") wherein each coefficient is shifted by $\pi/2$ radians compared with the corresponding coefficient in the first set.

The Prism concept includes a series of disclosed methods and systems based on the above. In a first disclosed method and a first disclosed system, there are two integration paths: a first integration path comprising a sequence of two integration stage blocks, each with sine coefficients, and a second integration path comprising a sequence of two integration stage blocks, each with cosine coefficients, whereby the final output signal is based on the sum of the output signals from the two integration paths. In a second disclosed method and a second disclosed system, there are also two integration paths: the first integration path comprises a sequence of two integration stage blocks, the first with sine coefficients and the second with cosine coefficients, while the second integration path comprising a sequence of two integration stage blocks, the first with cosine coefficients and the second with sine coefficients. In this case, the final output signal is based on the difference of the output signals from the two integration paths. In a third disclosed method and a third disclosed system, there are four integration paths and two final output signals, comprising both sets of integration paths and final outputs signals for the first two methods or systems respectively.

Significant advantages for the methods and systems disclosed here concern the computational efficiency that may be achieved. For example, another disclosed embodiment is the application of Romberg Integration in order to carry out the numerical integration described above, thereby achieving high numerical accuracy. In yet another embodiment, the numerical integration in each integration stage block is performed recursively, whereby the result for the current set of input samples in the data window is derived from values calculated for the previous set of input samples in the data window, wherein the calculation includes removing the influence of the oldest data sample in the previous data window and including the influence of the newest data sample in the current data window. This in turn facilitates disclosed systems and methods offering high computational efficiency whereby, for a particular instantiation, the computational burden of performing the filtering calculation is substantially similar irrespective of the length of the data windows.

Further disclosed embodiments describe methods and systems for utilizing the above filtering techniques together with additional calculations in order to estimate one or more parameter values of a sinusoid component within the original signal. Such parameter values include the frequency, amplitude and/or phase of the sinusoidal component, and in yet further disclosed methods and systems, parameter estimates are calculated for each new sample in the original signal.

One with ordinary skill in the art will appreciate that inherent to the methods and systems disclosed herein is the principle of networking: that yet further methods and systems may be derived by the judicious combination of the elements and techniques explicitly described here, and that such further methods and systems thereby remain within the spirit of the invention here disclosed.

ADDITIONAL ASPECTS AND EXAMPLES

In a first aspect, a method for filtering a signal, the method comprising: passing a first signal through two or more integration paths, one of the integration paths including a sequence of two or more integration stage blocks; and calculating at least one final output signal based on an arithmetical combination of outputs of the two or more integration paths, wherein each of the first signal and the at least one final output signal comprises a sequence of samples, each sample representing a value of the first signal or the at least one final output signal at a sampling time, wherein an integration stage block in the sequence of integration stage blocks: receives an input signal comprising a sequence of input samples and generates an output signal comprising a sequence of output samples; comprises a data window having an associated length in samples, the data window covering a sequence of most recent input samples received by the integration stage block, only the sequence of the most recent input samples influencing a corresponding output sample in the sequence of output samples generated by the integration stage block; multiplies a newly received input sample by a coefficient to generate a corresponding product value, the product value remaining unchanged while the data window covers the input sample; and calculates, at or after the sampling time, the corresponding output sample through a numerical integration over product values corresponding to the most recent input samples covered by the data window, wherein each of the two or more integration stage blocks comprises a same data window length, and wherein the output signal of a preceding block in the sequence of integration stage blocks forms the input signal to a next block in the sequence of integration stage blocks.

In a second aspect, the method of aspect 1, wherein a sequence of coefficients for the integration stage block comprises a recurring sequence of linearly spaced sinusoidal values, the recurring sequence corresponding to a whole number of sinusoid periods and being equal in length to the data window.

In a third aspect, the method of aspect 2, wherein the integration stage block comprises a first sequence of linearly spaced sine coefficients or a second sequence of linearly spaced cosine coefficients, a coefficient in the second sequence being shifted by $\pi/2$ radians compared with a corresponding coefficient in the first sequence.

In a fourth aspect, the method of aspect 3, wherein: the two or more integration paths comprise two integration paths, a first integration path comprising a sequence of two integration stage blocks each comprising the first sequence of sine coefficients, and a second integration path comprising a sequence of two integration stage blocks each comprising the second sequence of cosine coefficients, and wherein said calculating the at least one final output signal is based on a sum of outputs of the two integration paths, or the two or more integration paths comprise two integration paths, a first integration path comprising a sequence of two integration stage blocks, a first block comprising the first sequence of sine coefficients and a second block comprising the second sequence of cosine coefficients, and a second integration path comprising a sequence of two integration stage blocks, a first block comprising the second sequence of cosine coefficients and a second block comprising the first sequence of sine coefficients, and wherein said calculating the at least one final output signal is based on a difference of outputs of the two integration paths.

In a fifth aspect, the method of aspect 3, wherein the two or more integration paths comprise four integration paths and the at least one final output signal comprises two final output signals, a first integration path comprising a sequence of two integration stage blocks each comprising the first sequence of sine coefficients, a second integration path comprising a sequence of two integration stage blocks each comprising the second sequence of cosine coefficients, and said calculating the at least one final output signal comprising calculating a first final output signal based on a sum of outputs of the first and the second integration paths; a third integration path comprising a sequence of two integration stage blocks, a first block comprising the first sequence of sine coefficients and a second block comprising the second sequence of cosine coefficients, and a fourth integration path comprising a sequence of two integration stage blocks, a first block comprising the second sequence of cosine coefficients and a second block comprising the first sequence of sine coefficients, and said calculating the at least one final output signal comprising calculating a second final output signal based on a difference of outputs of the third and the fourth integration paths.

In a sixth aspect, the method of aspect 1, wherein the numerical integration comprises Romberg Integration.

In a seventh aspect, the method of aspect 1, wherein the numerical integration in the integration stage block comprises deriving a result from a current sequence of the input samples covered by the data window from a value derived from a previous sequence of the input samples covered by the data window, said deriving the result comprising removing an influence of an oldest input sample in the previous sequence of the input samples covered by the data window and including an influence of a newest input sample in the current sequence of the input samples covered by the data window.

In an eighth aspect, the method of aspect 1, further comprising calculating an estimate of a frequency of a sinusoid component of the first signal, an amplitude of the sinusoid component of the first signal, a phase of the sinusoid component of the first signal, or a combination thereof.

In a ninth aspect, the method of aspect 1, further comprising estimating a parameter of a signal embedded in the first signal.

In a tenth aspect, the method of aspect 1, wherein the first signal is generated by a sensor associated with Internet of Things.

In an eleventh aspect, a system for filtering a signal, the system comprising a filter that operates to: receive a first signal; pass the first signal through two or more integration paths, one of the integration paths including a sequence of two or more integration stage blocks; calculate at least one final output signal based on an arithmetical combination of outputs of the two or more integration paths; and output the at least one final output signal, wherein each of the first signal and the at least one final output signal comprises a sequence of samples, each sample representing a value of the first signal or the at least one final output signal at a sampling time, wherein an integration stage block in the sequence of integration stage blocks: receives an input signal comprising a sequence of input samples and generates an output signal comprising a sequence of output samples; comprises a data window having an associated length in samples, the data window covering a sequence of most recent input samples received by the integration stage block, only the sequence of the most recent input samples influencing a corresponding output sample in the sequence of output samples generated by the integration stage block; multiplies a newly received input sample by a coefficient to generate a corresponding product value, the product value remaining unchanged while the data window covers the input sample; and calculates, at or after the sampling time, the corresponding output sample through a numerical integration over product values corresponding to the most recent input samples covered by the data window, wherein each of the two or more integration stage blocks comprises a same data window length, and wherein the output signal of a preceding block in the sequence of integration stage blocks forms the input signal to a next block in the sequence of integration stage blocks.

In a twelfth aspect, the system of aspect 11, wherein a sequence of coefficients for the integration stage block comprises a recurring sequence of linearly spaced sinusoidal values, the recurring sequence corresponding to a whole number of sinusoid periods and being equal in length to the data window.

In a thirteen aspect, the system of aspect 12, wherein the integration stage block comprises a first sequence of linearly spaced sine coefficients or a second sequence of linearly spaced cosine coefficients, a coefficient in the second sequence being shifted by $\pi/2$ radians compared with a corresponding coefficient in the first sequence.

In a fourteenth aspect, the system of aspect 13, wherein: the two or more integration paths comprise two integration paths, a first integration path comprising a sequence of two integration stage blocks each comprising the first sequence of sine coefficients, and a second integration path comprising a sequence of two integration stage blocks each comprising the second sequence of cosine coefficients, and wherein the filter calculates the at least one final output signal based on a sum of outputs of the two integration paths, or the two or more integration paths comprise two integration paths, a first integration path comprising a sequence of two integration stage blocks, a first block comprising the first sequence of sine coefficients and a second block comprising the second sequence of cosine coefficients, and a second integration path comprising a sequence of two integration stage blocks, a first block comprising the second sequence of cosine coefficients and a second block comprising the first sequence of sine coefficients, and wherein the filter calculates the at least one final output signal based on a difference of outputs of the two integration paths.

In a fifteenth aspect, the system of aspect 13, wherein the two or more integration paths comprise four integration paths and the at least one final output signal comprises two final output signals, a first integration path comprising a sequence of two integration stage blocks each comprising the first sequence of sine coefficients, a second integration path comprising a sequence of two integration stage blocks each comprising the second sequence of cosine coefficients, and the filter calculates the at least one final output signal via calculating a first final output signal based on a sum of outputs of the first and the second integration paths; a third integration path comprising a sequence of two integration stage blocks, a first block comprising the first sequence of sine coefficients and a second block comprising the second sequence of cosine coefficients, and a fourth integration path comprising a sequence of two integration stage blocks, a first block comprising the second sequence of cosine coefficients and a second block comprising the first sequence of sine coefficients, and the filter calculates the at least one final output signal via calculating a second final output signal based on a difference of outputs of the third and the fourth integration paths.

In a sixteenth aspect, the system of aspect 11, wherein the numerical integration comprises Romberg Integration.

In a seventeenth aspect, the system of aspect 11, wherein the numerical integration in the integration stage block comprises deriving a result from a current sequence of the input samples covered by the data window from a value derived from a previous sequence of the input samples covered by the data window, said deriving the result comprising removing an influence of an oldest input sample in the previous sequence of the input samples covered by the data window and including an influence of a newest input sample in the current sequence of the input samples covered by the data window.

In an eighteenth aspect, the system of aspect 11, further comprising: a signal tracker that operates to receive the at least one final output signal and calculate an estimate of a frequency of a sinusoid component of the first signal, an amplitude of the sinusoid component of the first signal, a phase of the sinusoid component of the first signal, or a combination thereof.

In a nineteenth aspect, the system of aspect 11, further comprising: a signal tracker that operates to receive the at least one final output signal and to estimate a parameter of a signal embedded in the first signal.

In a twentieth aspect, the system of aspect 11, wherein the first signal received by the filter is generated by a sensor associated with Internet of Things.

BRIEF DESCRIPTION OF THE DRAWINGS

FIG. 2A is an exemplary graph illustrating the technique of composite trapezoidal Integration, using n=8.

FIG. 2B is an exemplary graph illustrating the technique of composite trapezoidal Integration, using n=16.

FIG. 10A is an exemplary graph showing how the gain of the functions $G_s$, $G_c$, $G_z$ and $G_k$ vary with frequency on a linear scale.

FIG. 10B is an exemplary graph showing how the magnitude of the relative gain of the functions $G_s$, $G_c$, $G_z$ and $G_k$ vary with frequency on a logarithmic (decibel) scale.

FIG. 15A is an exemplary graph showing how the gain of the function Gs, with h=3 and m=29.93 Hz, varies with frequency on a linear scale.

FIG. 15B is an exemplary graph showing how the magnitude of the relative gain of the function Gs, with h=3 and m=29.93 Hz, varies with frequency on a logarithmic (decibel) scale.

FIG. 16A is an exemplary graph showing how the relative gain of a Prism-based bandpass filter centred on 100 Hz varies with frequency on a linear scale.

FIG. 16B is an exemplary graph showing how the magnitude of the relative gain of a Prism-based bandpass filter centred on 100 Hz varies with frequency on a logarithmic (decibel) scale.

FIG. 19A is an exemplary graph showing the power spectrum of the unfiltered noisy time series of FIG. 18A.

FIG. 19B is an exemplary graph showing the power spectrum of the noisy time series of FIG. 18A after filtering by the band-pass pre-filter shown in FIG. 17.

FIG. 20A is an exemplary graph showing the true and RST-tracked frequency parameter value for the noisy input signal shown in FIG. 18A.

FIG. 20B is an exemplary graph showing the error in the RST-tracked frequency value shown in FIG. 20A, on a linear scale.

Figure 1:
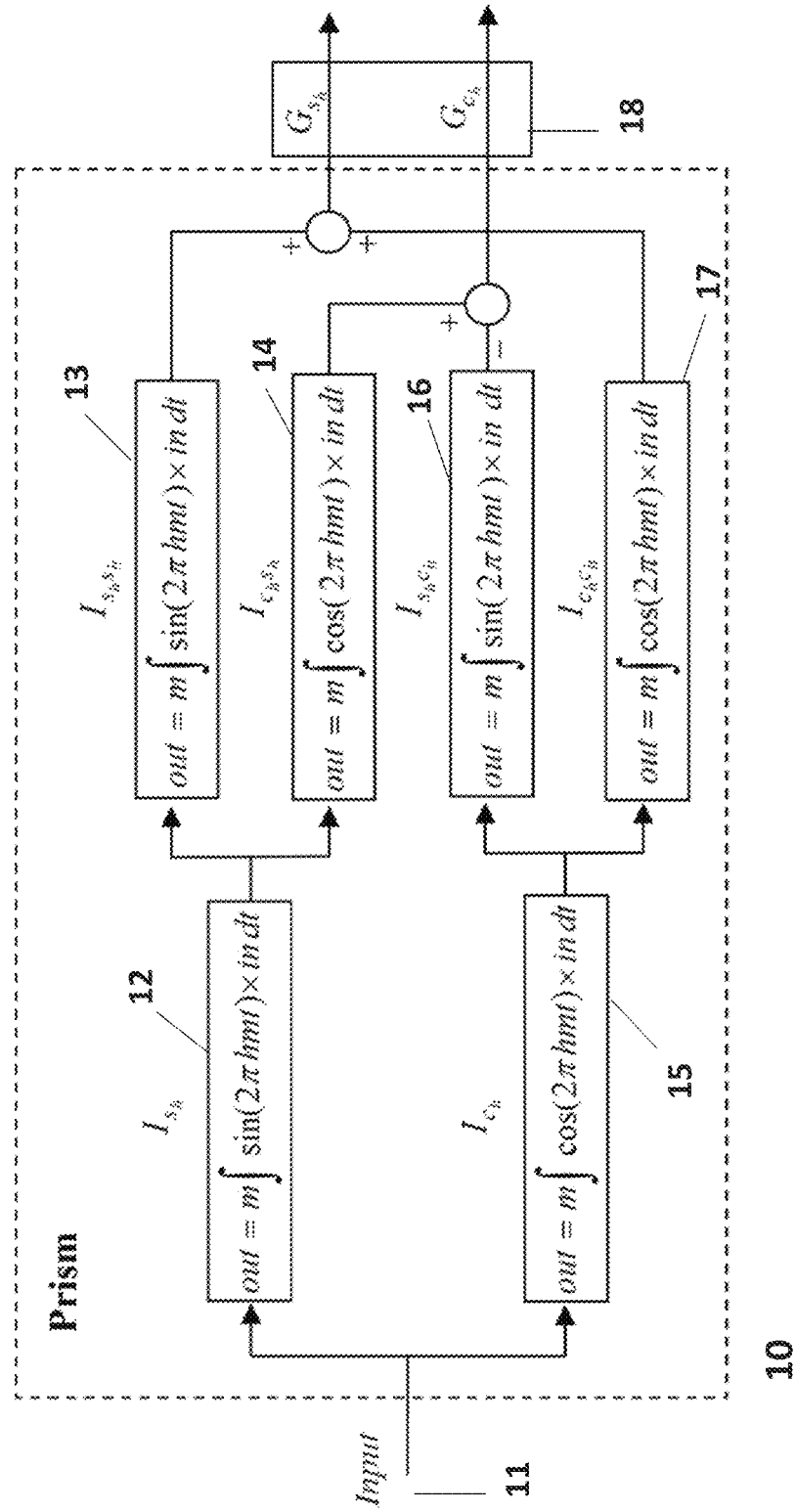
FIG. 1 is an exemplary schematic view of an embodiment of a signal processor employing a double integration method to create two time dependent outputs. This signal processor is referred to as a Prism.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

DETAILED DESCRIPTION

The Prism

The disclosed solutions to the various problems identified above are answered by the methods and systems of the Prism, which has the following attributes:

An embodiment of the Prism can be considered as a FIR filter (or as a coupled pair of FIR filters) that uses a recursive sliding window technique, so that the computation burden is independent of the window length, with linear phase response and good numerical stability. The design process for the embodiment is simple, as it only requires sinusoidal coefficients, and can easily be carried out on-line with limited computational resources. Thus it is possible to create new filters to match the observed signal characteristics, for example as these evolve over time or in response to an external request, even within a resource-limited field device.

It is straightforward to combine two or more Prisms into a chain or network in order to match more sophisticated signal processing requirements, such as (static) notch filtering or band-pass filtering. Each Prism can be extended to provide a second output, where the two outputs are generally orthogonal (i.e., have a phase difference of π/2 radians). A variety of sinusoid trackers can be constructed to calculate estimates of the frequency, phase and/or amplitude of the monitored signal, each using a Prism network and a detection calculation. The resulting calculations may be simple, have low computational cost, and have accuracy results, even for short window lengths and with a low signal-to-noise ratio.

Embodiments of the Prism may include systems, utilizing mechanical or electronic sensors and/or microprocessors or other devices capable of computation, or methods using the disclosed techniques. The methods and systems utilizing an embodiment of the Prism perform double integrals of the form:

$$I_{[s|c]_h[s|c]_h} = \int_{-\frac{1}{m}}^{0} [\sin|\cos](2\pi hmt)\left(\int_{t-\frac{1}{m}}^{t}[\sin|\cos](2\pi hmt) \cdot s(t)dt\right)dt \quad \text{Equation (1)}$$

Here the notation [s|c] is used to indicate the selection of one alternative between s (for sine) and c (for cosine). h is the harmonic number, normally a small positive integer, usually 1 or 2. m may be the characteristic frequency of the Prism. s(t) denotes an input signal. Its amplitude, frequency, and phase are denoted by A, f, and φ, respectively. Amplitude, frequency, and phase typically change with time.

Although the mathematical analysis described in these disclosures may be stated in terms of continuous notation (for example using integration rather than summation), it will be understood by those familiar with the art that a practical implementation may be based upon digitally sampled signals, and that mathematical results in the continuous domain can, with due care, be mapped onto the discrete time domain. For example, Romberg Integration is one technique that may be applied to obtain accurate results from discrete samples of data, which may provide a good approximation to the theoretical value of the continuous integral equivalent.

With regard to the discrete time implementation of an embodiment of the Prism, given a sampling rate fs, the choice of m is restricted to ensure that fs/m is an integer: this quantity gives the whole number of samples in each of the two data windows used for numerical integration. As discussed below, where Romberg Integration is used, slightly greater restrictions are placed on the selected value of m, for example that fs/m must be a positive multiple of some power of two (for example 4n, where n is any positive integer).

Where the Prism is being used as part of a sinusoid tracking system, then typically m is selected to be higher than the frequency range of the sinusoids to be tracked. For example, using a fixed sampling rate between 10 and 100 kHz, sinusoids in the range 50-180 Hz might be tracked using double integrals with a value of mat around 200 Hz.

The integral limits may be selected so that φ, the phase of s(t) at t=0, is also the phase of the most recent sample. In other words, calculating φ gives the phase at the end of the data window, rather than (for example) the phase at the mid-point of the double integral. Note that the double integral extends in time from −2/m to 0: its duration is 2/m.

Accordingly, viewed as an FIR filter, this embodiment can be considered as having an order (i.e., the length of the data window in samples) of 2fs/m.

The harmonic number can be considered in the following terms. Over each integral window, the modulation function is a sinusoid (either sine or cosine) which is multiplied by the input signal: for the inner integral, the input is the original signal s(t); for the outer integral the input is the value supplied as an output from the inner integral. When the harmonic number is one, one complete cycle of the modulation function stretches over the window of data associated with each integral: thus the frequency of the modulation function is m. When the harmonic number is two, two cycles exactly cover each data window, and thus the frequency of the modulation function is 2m, and so on. This is further discussed below in the context of FIGS. 3 and 4, which illustrate different harmonic numbers.

Given that harmonic numbers 1 and 2 are most frequently applied, a simplified notation is used (except where stated): s and c are used to represent sin and cos with h=1, and z and k are used to represent sin and cos with h=2. Thus:

$$I_{ss} = \int_{-\frac{1}{m}}^{0} \sin(2\pi mt) \left( \int_{t-\frac{1}{m}}^{t} \sin(2\pi mt) \cdot s(t) dt \right) dt \quad \text{Equation (2)}$$

and $$I_{zk} = \int_{-\frac{1}{m}}^{0} \sin(4\pi mt) \left( \int_{t-\frac{1}{m}}^{t} \cos(4\pi mt) \cdot s(t) dt \right) dt \quad \text{Equation (3)}$$

Analytically, these integrals are equivalent to the following expressions:

$$I_{ss} = \frac{A}{m^2} \operatorname{sinc}^2(r) \frac{-3r^2}{(r^2-1)(r^2-4)} \sin(\phi - 2\pi r) \quad \text{Equation (4)}$$

and $$I_{zk} = \frac{A}{m^2} \operatorname{sinc}^2(r) \frac{2r(r^2+8)}{(r^2-4)(r^2-16)} \cos(\phi - 2\pi r) \quad \text{Equation (5)}$$

Here r is the frequency ratio of the input sinusoid, defined as:

$$r = f/m, \quad \text{Equation (6)}$$

so that r=0 when f=0 Hz and r=1 when f=m Hz. Typically r<1 for a sinusoid being tracked, but higher values of r may be important when considering the filtering properties of the Prism.

sin c(x) is the normalised sin c function defined as follows:

$$\operatorname{sinc}(x) = \frac{\sin(\pi x)}{\pi x} \quad \text{Equation (7)}$$

The utility of the double integral approach begins to emerge from these equations. By passing the signal through several different double integrals in parallel, a set of algebraically related functions may be calculated, from which the values of r (and hence f, as well as A and φ) may be deduced. Also, some integrals in the family result in sine functions, and some in cosine functions; those familiar with the art will recognize these properties as valuable, suggesting a strategy of constructing orthogonal pairs of integral values (analogous to the analytic function) from which to derive the sinusoid parameters A and φ.

Both sine and cosine terms in Equations 4 and 5 have a common delay term 2πr. This is the linear phase delay characteristic of certain FIR filters where the time delay is 1/m, i.e. half the double integral length. Thus integrals of this type have a desired linear phase characteristic.

However, before further consideration of algebraic solutions to this family of integral equations, it is necessary to address the issue of evaluating the numerical values of the double integral in an efficient manner. This results in a significant simplification of the algebraic form of the equations to be solved.

Evaluating double integrals numerically may require many calculations. For example, if the discrete, numerical equivalent of Equation 2 were evaluated in a straightforward manner, the number of multiplications of signal value by modulating sine value would be the square of the number of samples in each integral. For, say 100 sample points, this would require 10,000 multiplications, even before any further calculations were performed to accumulate the double integral value. In some cases, this may be more than the processing power available for a calculation.

A common technique for reducing the computational load of calculations over a window of data is to use a sliding window technique combined with recursion. Here the algorithm is rearranged so that the calculation at sample n+1 is based primarily on results previously calculated at sample n, typically by subtracting the contribution of the oldest value in the window and adding in the contribution of the newest. Applying this technique to an integration (or indeed a double integration) calculation is potentially straightforward. However, given the particular form of integral under consideration here, a potential difficulty arises in forming the product of the signal and the modulating sine or cosine value. Equation 2 implies that the initial phase of each of the modulating sine functions is zero for each integral. This in turn implies recalculating the product of signal and modulation function across the whole integral for each new sample. To apply a recursive sliding window approach to Equation 2, it would be necessary for the modulating function to 'slide with' the signal, so that all (but the oldest) of the signal/modulation function products at time step n remain valid for time step n+1.

This requirement can be expressed mathematically by introducing an additional variable, q, which represents the initial phase of the modulating functions, no longer assumed to be zero. As both integrals have the same length, there is no loss of generality to assume that the phase offset is the same for both. Thus, the definition of $I_{ss}$ given in Equation 2 could be generalised to:

$$I_{ss} = \int_{-\frac{1}{m}}^{0} \sin(2\pi mt + q) \left( \int_{t-\frac{1}{m}}^{t} \sin(2\pi mt + q) \cdot s(t) dt \right) dt \quad \text{Equation (8)}$$

In an efficient discrete time instantiation, the values of q may be restricted to the set 2π×k×m/fs radians (modulo 2π), where k=0, 1, 2, . . . window length−1, so that the modulation function values sin(2πmt+q) (as well as cos(2πmt+q)) are fixed values which can be calculated once when the Prism is instantiated, in order to be stored and then continuously reused throughout the operation of the Prism. In this case, q represents the phase of the first modulation function value of any particular integral, where the same fixed modulation function values are cycled through from that initial point.

Introducing q into the definitions of the integral family may result in analytic expressions for the double integrals which may retain a dependency on q and therefore are not amenable to the proposed recursive calculation—these are given below in equations. Fortunately, however, the combination or grouping of certain pairs of integrals yields simple analytic results which are independent of q. These groups facilitate the use of a recursive sliding windows calculation that may significantly reduce the computational effort required to numerically evaluate the double integrals.

Given the revised definition of $I_{ss}$ in Equation 8, and the corresponding definition of $I_{cc}$:

$$I_{cc} = \int_{-\frac{1}{m}}^{0} \sin(2\pi mt + q)\left(\int_{t-\frac{1}{m}}^{t} \sin(2\pi mt + q) \cdot s(t)dt\right)dt \quad \text{Equation (9)}$$

Then the group $G_s$ formed from their sum has a simple analytic expression which is independent of q.

$$G_s = m^2(I_{ss} + I_{cc}) = A\mathrm{sinc}^2(r)\frac{r^2}{r^2-1}\sin(\phi - 2\pi r) \quad \text{Equation (10)}$$

Similarly, defining integrals $I_{sc}$ and $I_{cs}$ as follows:

$$I_{sc} = \int_{-\frac{1}{m}}^{0} \sin(2\pi mt + q)\left(\int_{t-\frac{1}{m}}^{t} \cos(2\pi mt + q) \cdot s(t)dt\right)dt \quad \text{Equation (11)}$$

$$I_{cs} = \int_{-\frac{1}{m}}^{0} \sin(2\pi mt + q)\left(\int_{t-\frac{1}{m}}^{t} \sin(2\pi mt + q) \cdot s(t)dt\right)dt \quad \text{Equation (12)}$$

then these integrals can be combined into a group $G_c$:

$$G_c = m^2(I_{cs} + I_{sc}) = A\mathrm{sinc}^2(r)\frac{r^2}{r^2-1}\cos(\phi - 2\pi r). \quad \text{Equation (13)}$$

So, by accepting the overhead of calculating two double integral pairs, simple analytic expressions are obtained for the sum (or difference) of the integrals, where their numerical values can be calculated efficiently using sliding windows and recursion. The multiplication by the factor $m^2$ in Equation 10 and Equation 13 provides a convenient independence from m in the resulting analytic expressions. Note also that the pair $G_s$ and $G_c$ are orthogonal to one another and very nearly form an analytic signal—they differ only by a factor r.

The results in Equation 10 and Equation 13 are the first in a series obtained for the integrals for higher harmonic numbers. Readopting the earlier h notation, and emphasizing that the following results are true when the q term is included in the integral definitions, the following results are found:

$$G_{s_h} = m^2(I_{s_h s_h} + I_{c_h c_h}) = A\mathrm{sinc}^2(r)\frac{r^2}{r^2-h^2}\sin(\phi - 2\pi r) \text{ and} \quad \text{Equation (14)}$$

$$G_{c_h} = m^2(I_{c_h s_h} + I_{s_h c_h}) = A\mathrm{sinc}^2(r)\frac{hr}{r^2-h^2}\cos(\phi - 2\pi r) \quad \text{Equation (15)}$$

These results have been verified using the Matlab® Computer Algebra toolbox for all h≤20. Note that for each harmonic number the close analogy between the two integral groups and an analytic function is preserved: in general, the ratio between each pair (excluding the orthogonal sine/cosine functions) is r/h.

These simple analytic expressions for the double integral groups are central to the definition of the Prism.

The Prism may be defined as a signal processing object that receives a time series signal as an input, and which generates, via numerical integration, one or more time dependent outputs. These time dependent outputs may correspond to the sample-by-sample values of one or both of $G_{s_h}$ and $G_{c_h}$ as defined in Equation 14 and Equation 15. As discussed above, the Prism may have two primary configuration parameters, m and h. Other configuration parameters may determine whether one or both of the outputs are generated. As a signal processing object, the Prism may be incorporated into systems and/or methods of detecting sinusoidal wave components.

FIG. 1 shows an embodiment of the Prism 10, which takes a time series signal as input 11 and comprises six single integration stage blocks (block 12, block 13, block 14, block 15, block 16 and block 17), arranged in a cascade of two layers and/or two integration tracks. One exemplary integration track comprises block 12, block 13 and block 14. Another exemplary integration track is comprised of block 15, 16 and 17. The cascade of two layers refers to the process by which the outputs of the first integration stage blocks (block 12 and block 15) are each then processed in the second integration stage blocks (block 13, block 14, block 16 and block 17). The equations in each integration block are exemplary only; other equations are possible. Block labels, e.g. $I_{s_h}$, are provided for convenience only. Each integration block accepts a single input signal and generates a single output signal, which comprises the input signal multiplied by the selected modulation function and then integrated over the last 1/m seconds. The integration may be implemented efficiently using a recursive sliding window arrangement where the q term (not shown in the diagram equations) is included and incremented with each sample update. A factor m may be included at each stage to effect the multiplication by $m^2$ required in Equation 14 and Equation 15. The signals may be routed between the integration blocks, with the second stage integral outputs combined to form the time dependent outputs 18 $G_{s_h}$ and $G_{c_h}$.

Note that the term 'block,' 'stage block,' 'integration stage block' or 'signal processing block' may be used throughout these disclosures to indicate some means of performing a numerical calculation, whether by hardware, software, or other means. The term is not meant to imply any restriction in the computational architecture, methodology or instantiation; it is simply a convenient label to identify and discuss the various method or system steps presented in this disclosure.

Organised as a cascade of single integrations (FIG. 1), implementation of the Prism can be seen as a straightforward task. However, the application of more sophisticated integration techniques may lead to significant improvements in numerical accuracy, with only limited additional computational cost.

Those familiar with the art will recognise that conventional integration techniques for a time series consisting of an arbitrary number of samples include the rectangular and the trapezoidal methods. However, when specifying a Prism, the exact length in samples of each the integrals, fs/m, has a degree of flexibility, because any specific value of m will provide good tracking over a reasonably broad range of frequencies (as illustrated below). A minimum requirement is that fs/m must correspond to a whole number of samples.

However, if the length of each integral is further constrained, then Romberg Integration (adapted to operate over a sliding window) can be applied, offering the potential for significant improvements in numerical accuracy.

Romberg Integration

Romberg Integration (RI) is a powerful and widely-used technique in numerical analysis. Dutka (J. Dutka, "Richardson Extrapolation and Romberg Integration", Historia Mathematica, Vol. 11, (1984) pp 3-21) provides a historical review of its background and development. In summary, RI generates a sequence of trapezoidal integrations over the interval of interest, and combines the results of these integrations to significantly reduce numerical error.

Before proceeding, an important distinction is noted. Conventionally, RI is applied to a function which can be evaluated at any point over the desired interval, and such evaluations can occur in any order. In Prism signal processing, RI is applied to a time series, in which the spacing and the ordering of the data is fixed. The only degree of freedom is the number of data points to be used in the integral—and that is constrained, as will be explained shortly. This difference of approach leads to an unconventional formulation of the RI calculation, but the key mechanism remains unchanged.

The graph 20 in FIG. 2A shows the trapezoidal integration of a time series over an interval [a, b] of nine equally-spaced sample values. The dotted line shows the continuously varying true function, while the sequence of adjacent trapeziums are formed by drawing straight lines between the sample values of the function. Note that for this example only, an alternative notation is used: here, s refers to the sample number in an integral, and f is the corresponding function value; this nomenclature is adopted in order to facilitate discussion of different levels of sample density over the same time interval. The integral value between the first two sample points, $s_0$ and $s_1$, may be approximated by calculating the area of the corresponding trapezium:

$$\int_{s_0}^{s_1} f(s)ds = \frac{(f_0 + f_1)}{2} h \quad \text{Equation (16)}$$

where $f_i = f(s_i)$ and $h = (b-a)/n$ is the inter-sample step size, n being the number of samples minus 1 ((9−1) or 8 in FIG. 2A). Extending this formula to the entire interval, the composite trapezoidal formula is:

$$\int_{a=s_0}^{b=s_n} f(s)ds = \left(\sum_{k=1}^{n-1} f_k + \frac{(f_0 + f_n)}{2}\right) h \quad \text{Equation (17)}$$

The plot 22 in FIG. 2B shows another trapezoidal integral of the same function over the same interval [a, b], where the step size has been halved. Note that this integral uses all of the sample values in FIG. 2A, but includes an intermediary point between each pair. To assist understanding, it is helpful to bear in mind that there are always n+1 sample values, indexed from zero up to n, over an integration period of length n×h, or of length n samples. This terminology and notation is useful as n itself is typically a multiple of two, and is readily doubled when the sample step is halved and vice versa.

As might be expected, the integration error of the second integral is smaller than that of the first. However, the principle behind RI provides a mechanism for combining these two integral values to significantly reduce integral error.

As discussed in Dutka, if f(s) is assumed to have a sufficient number of continuous derivatives, then the error term for the composite trapezoidal rule can be written as $$E = \sum_{i=1}^{\infty} \beta_i h^{2i} \quad \text{Equation (18)}$$

i.e. as a polynomial expansion in $h^2$, where the numerical values $\beta_i$ are unknown but, crucially, independent of h if h is sufficiently small (or equivalently, if n is large enough). Given this error structure, RI defines a procedure whereby the lowest terms in this expansion can be successively removed, by combining different integral values obtained over the same interval but using different step lengths. For example, the integral in FIG. 2B has half the step size of the integral in FIG. 2A. Let the numerically calculated values of the two integrals be written as:

$$I_1 = I_{true} + \beta_1 h_1^2 + o(h_1^4) \quad \text{Equation (19)}$$

$$I_2 = I_{true} + \beta_1 (h_1/2)^2 + o(h_1^4) \quad \text{Equation (20)}$$
$$= I_{true} + \frac{\beta_1}{4} h_1^2 + o(h_1^4)$$

where $I_1$ and $I_2$ are the values of the upper and lower integrals shown in FIGS. 2A and 2B, respectively, $I_{true}$ is the true value of the integrated function over the selected interval, $h_1$ is the step length of the first integral, and $o(h_1^4)$ represents terms of fourth order and higher. The error terms in $h^2$ can be eliminated using a linear combination of the two integral values:

$$I_{2,1} = \frac{4I_2 - I_1}{3} \quad \text{Equation (21)}$$
$$= I_{true} + o(h_1^4)$$

Equation 21 is equivalent to the well-known composite Simpson rule for integration. The RI process generally consists of generating a series of such integral values and combining them to eliminate successively higher error terms. This is illustrated in FIGS. 3 to 7, which are based on the calculations that are typically performed in the first level of Prism integration (e.g., $I_{s_h}$ 12 in FIG. 1).

Figure 3:
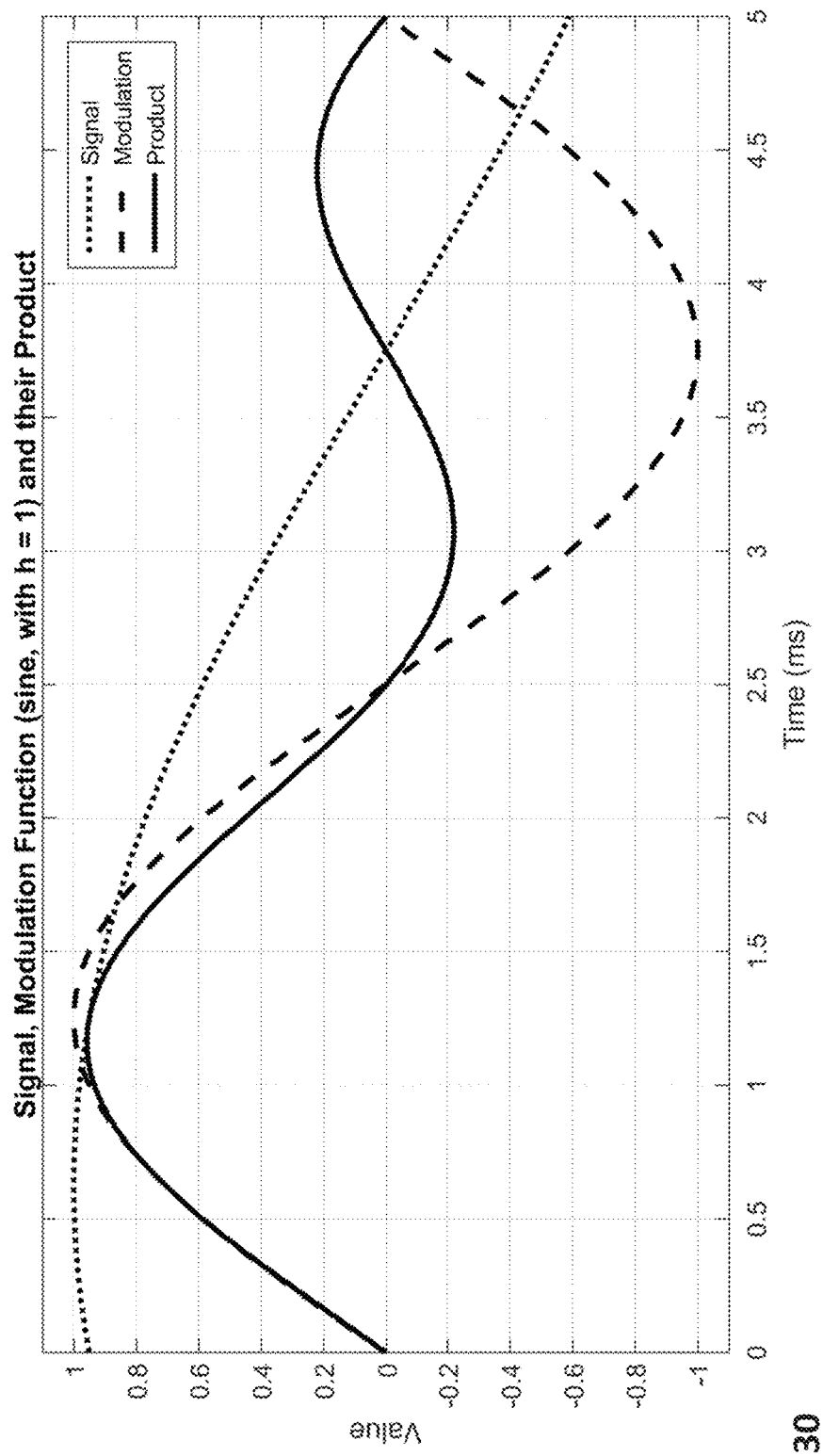
FIG. 3 is an exemplary graph illustrating the multiplication of an input signal by a modulation function to produce a product function, where the harmonic number is 1.
Figure 4:
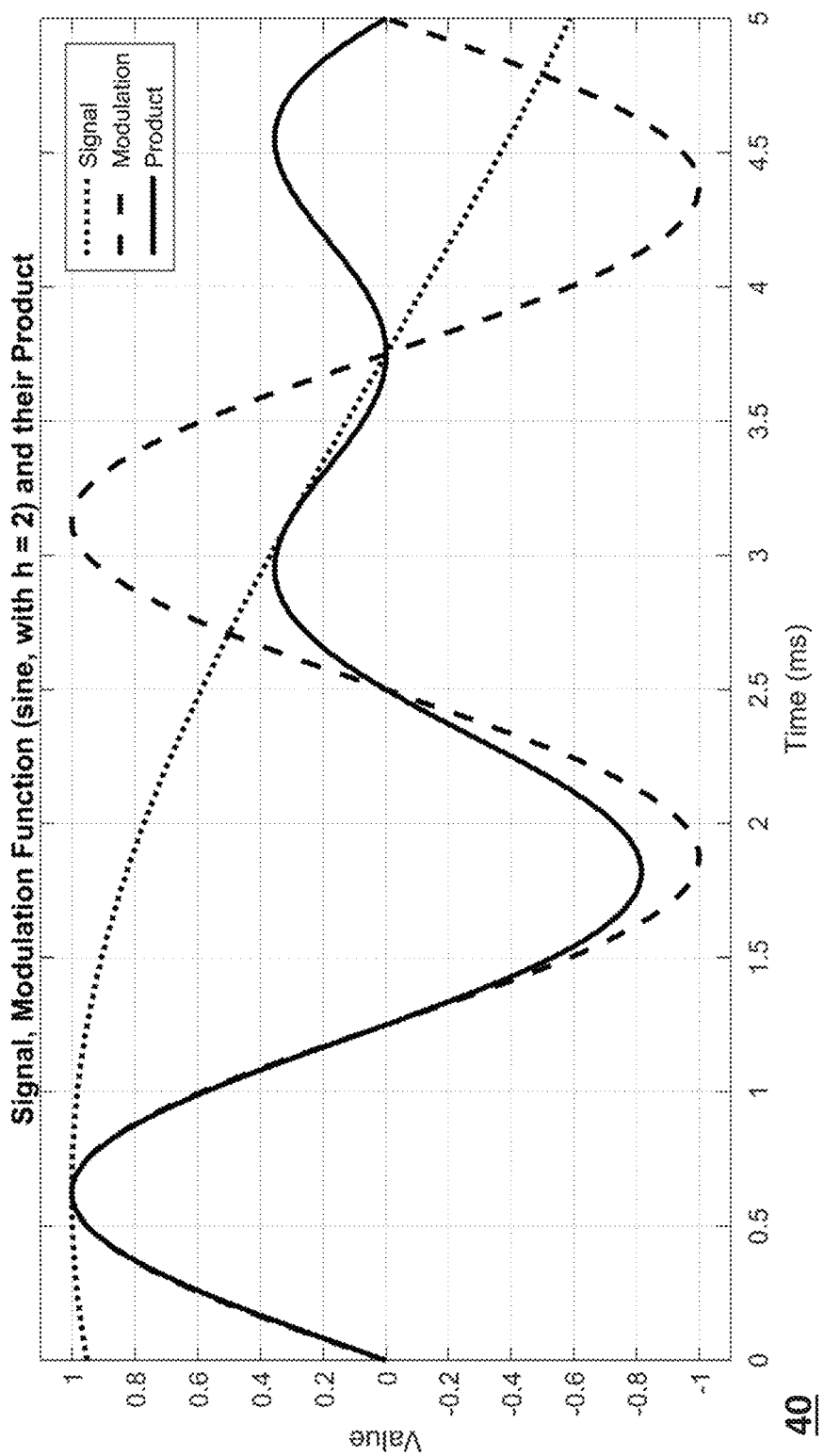
FIG. 4 is an exemplary graph illustrating the multiplication of an input signal by a modulation function to produce a product function, where the harmonic number is 2.

The graph 30 in FIG. 3 shows a 5 ms window, corresponding to the integration period for m=200 Hz. The dotted line is the input signal, an 80 Hz pure sinusoid with unit amplitude and an initial phase of $0.4\pi$ radians. The dashed line is the sinusoidal modulation function where h=1; the frequency is m Hz, with an initial phase of 0 radians. The solid line is the product of the input signal and the modulation function, which is to be integrated. As a means of illustrating the concept of harmonic number h, the graph 40 in FIG. 4 shows the corresponding plots when h=2. The input signal shown as the dotted line is unchanged, but the modulation function shown as the dashed line completes two full cycles over the 5 ms window, and thus has a frequency of 2m. The product function, shown as the solid line, therefore also differs from that of FIG. 2. With each higher harmonic, another cycle is completed by the modulation function within the 5 ms window: in general, the modulation function has a frequency hm. However, further discussion of the role of Trapezoidal and Romberg integration will be restricted to methods for integrating the product function of the signal and first harmonic (i.e. with h=1) shown in FIG. 2.

Figure 5:
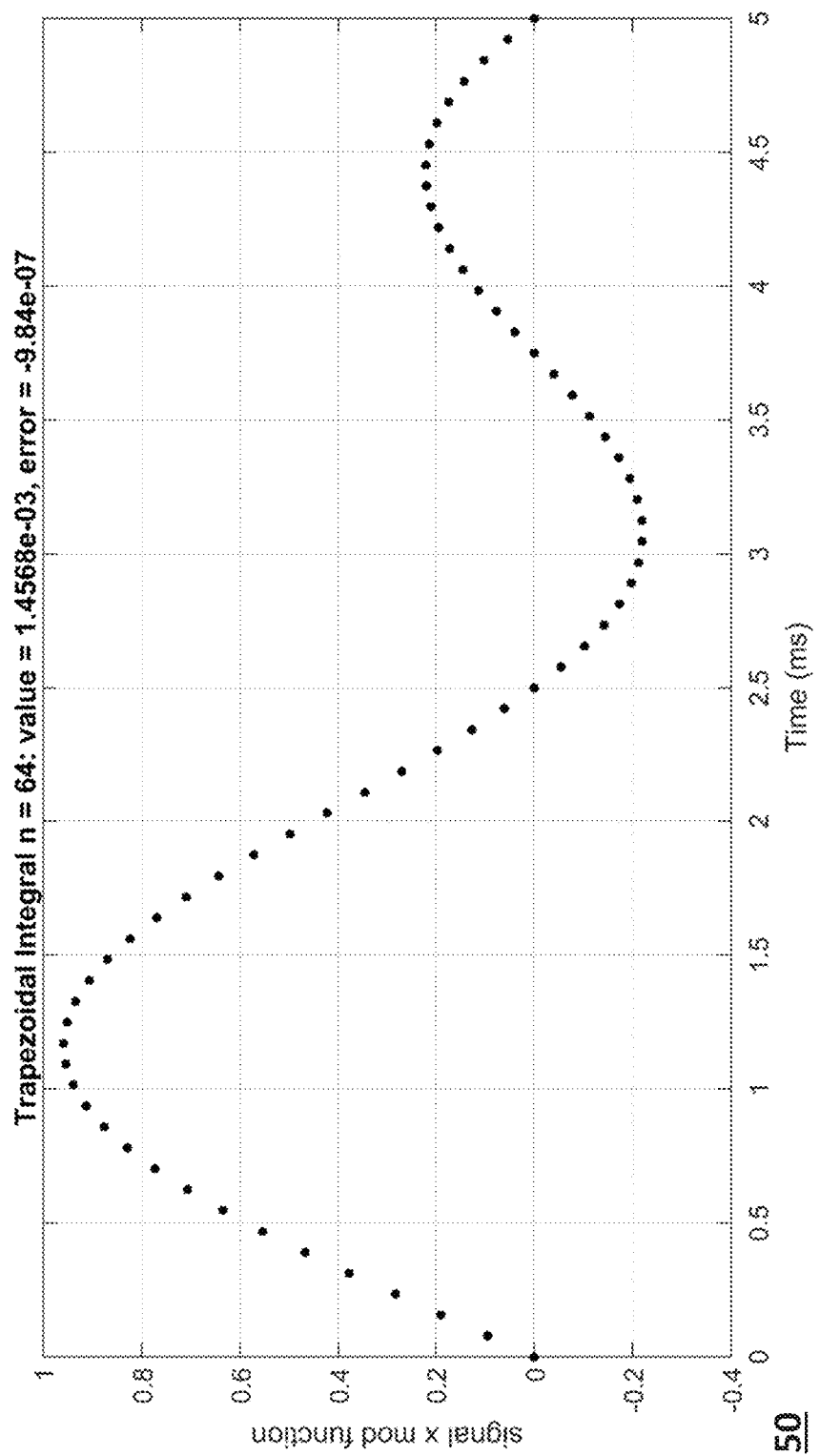
FIG. 5 is an exemplary graph illustrating trapezoidal integration of a product function with n=64.
Figure 6:
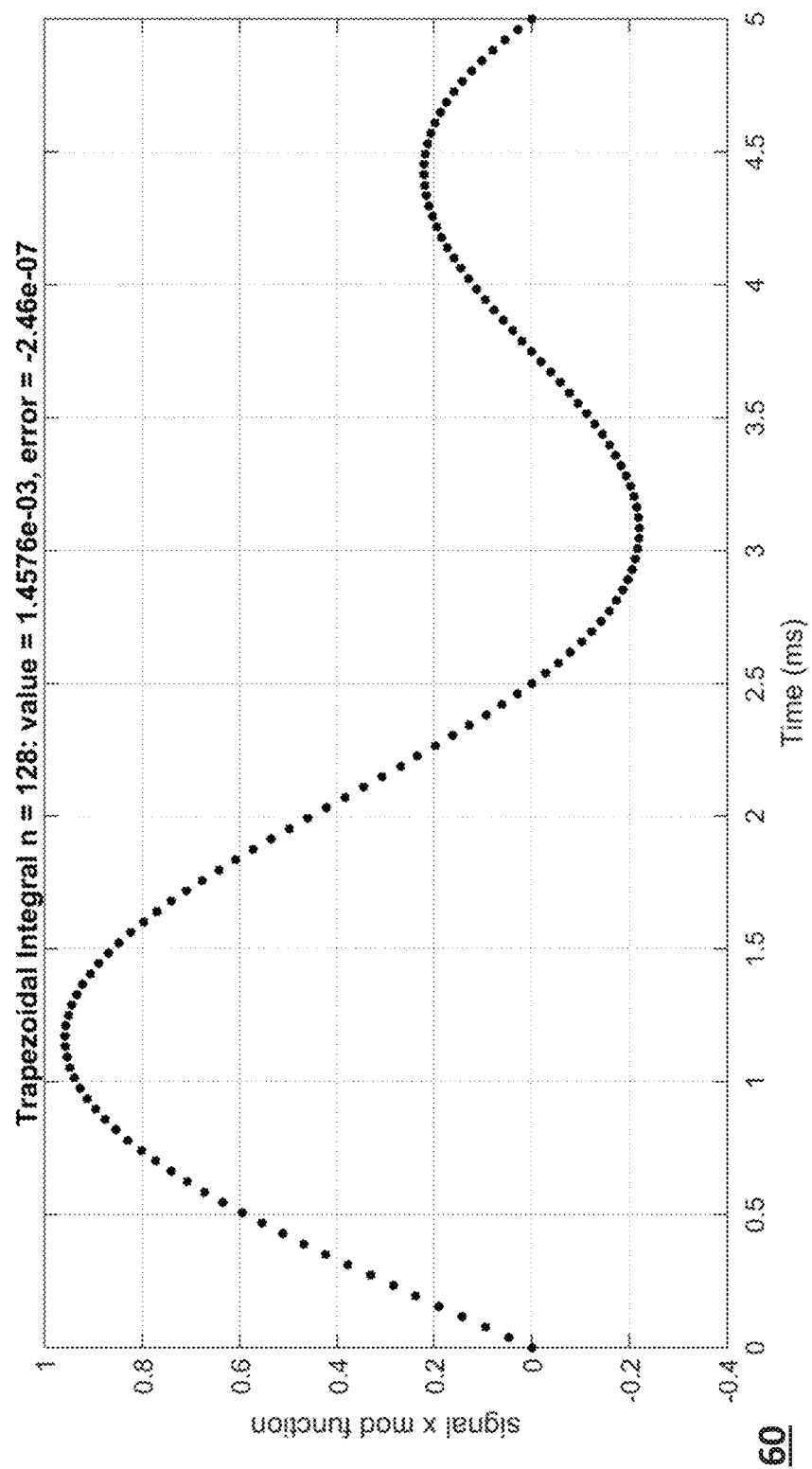
FIG. 6 is an exemplary graph illustrating trapezoidal integration of a product function with n=128.
Figure 7:
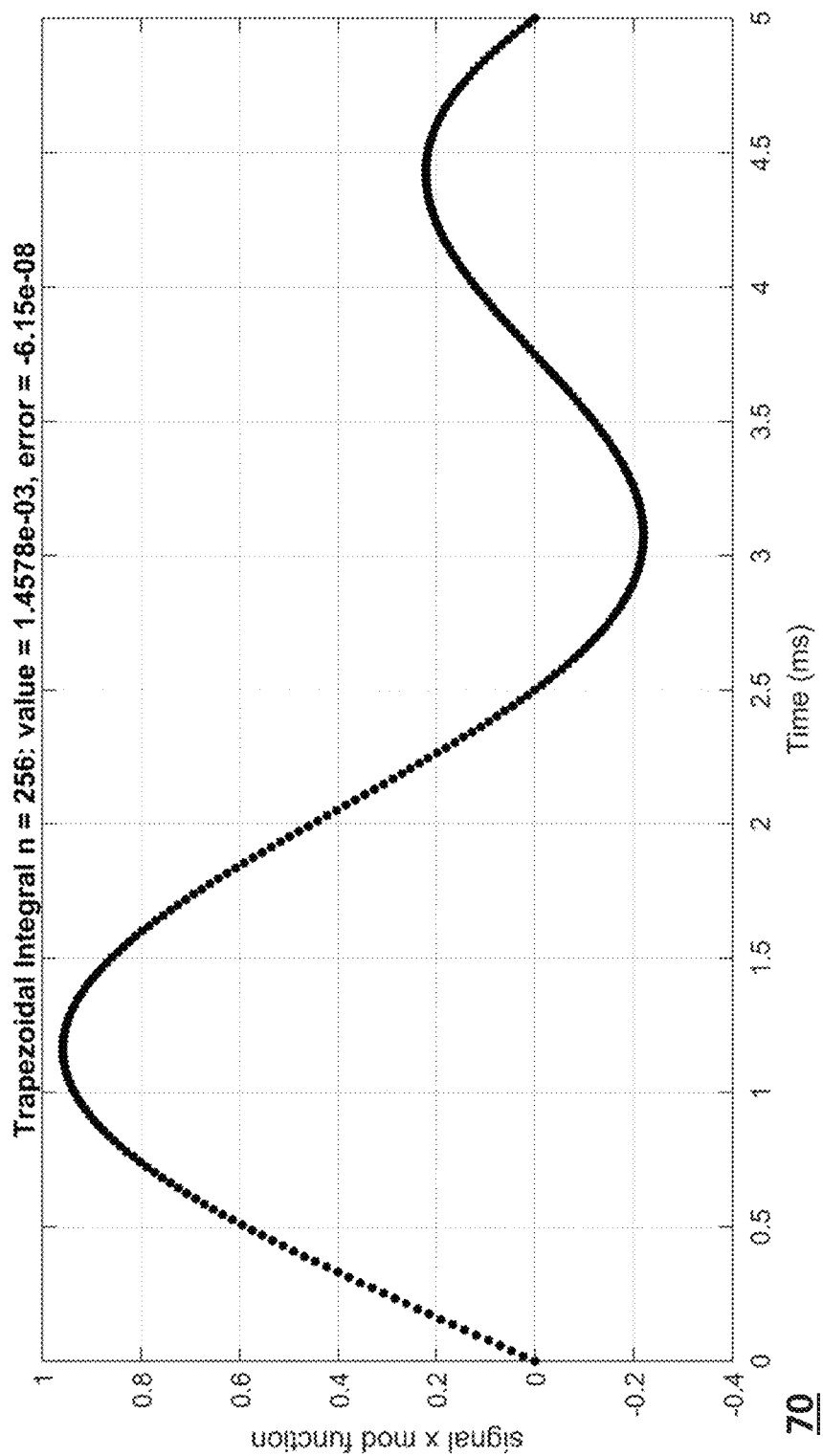
FIG. 7 is an exemplary graph illustrating trapezoidal integration of a product function with n=256.

FIG. 5 (graph 50) depicts the integration points and results for applying Trapezoidal integration with n=64. FIG. 6 (graph 60) depicts the integration points and results for applying Trapezoidal integration with n=128. FIG. 7 (graph 70) depicts the integration points and results for applying Trapezoidal integration with n=256. Using Matlab® Symbolic Toolbox, the true value of the integral is (to high precision) 1.4578230601606863e-03.

Table 1 gives the values of the trapezoidal integrals in FIGS. 5 to 7, and the corresponding error, to high precision. As the step size halves, it can be seen that the error is reduced to approximately one quarter of its previous value. However, to achieve significantly larger reductions in error using trapezoidal integration alone would require very high sampling rates.

TABLE 1

Trapezoidal integral values and errors

| Integral | Value | Error (absolute) | Error ( % ) |
|---|---|---|---|
| $I_{64}$ | 1.456839262179653e-03 | −9.8379798e-07 | −6.748e-4 |
| $I_{128}$ | 1.457577154533025e-03 | −2.4590563e-07 | −1.687e-4 |
| $I_{256}$ | 1.457761586494408e-03 | −6.1473666e-08 | −4.217e-5 |

Table 2 demonstrates how, using these trapezoidal integration results, the Romberg integration method generates substantial further reductions in error. The first two rows of the table show the results of applying Equation 21 to the pairs ($I_{128}$, $I_{64}$) and ($I_{256}$, $I_{128}$) respectively. In each case, the integration error is reduced by around four orders of magnitude. The final row of Table 2 shows the results of applying a second stage of Romberg integration. Here, the results of the first stage are themselves combined to eliminate the next term in the error polynomial of Equation 18, i.e. $h^4$. Accordingly, the scaling factor for a second stage combination is $4^2=16$. Higher stage combinations may be calculated as desired, using a scaling factor for the $k^{th}$ stage of $4^k$. For example, using five stages of Romberg integration (starting with trapezoidal integral values of n=16, 32, 64, 128, and 256), the final RI value is 1.4578230601606859e-03, with an absolute (i.e., not relative to the true value) error of −4.3e-19.

TABLE 2

Romberg integration: calculated values and errors

| New Estimate | Calculation | Value | Error (absolute) | Error (%) |
|---|---|---|---|---|
| $I_{128,64}$ | $(4.I_{128} - I_{64})/3$ | 1.457823118650816e-03 | 5.8490e-11 | 4.012e-8 |
| $I_{256,128}$ | $(4.I_{256} - I_{128})/3$ | 1.457823063814869e-03 | 3.6541e-12 | 2.507e-9 |
| $I_{256,128,64}$ | $(16.I_{256,128} - I_{128,64})/15$ | 1.457823060159140e-03 | −1.5467e-15 | −1.061e-12 |

The RI process demonstrates similar effectiveness with smaller values of n. For example, consider a sample rate fs of 64 kHz, and an input signal at 800 Hz. Using m=2000 Hz, so that n=32, and with an initial signal phase of $0.47\pi$ radians, the following results are obtained:

True integral value: 1.457823e-04
Trapezoidal error using n=32: −3.9e-07
Romberg Integration error using 5 stages: −5.5e-12

Note that n=32 is the smallest number of points that can support 5 RI stages. Increasing n to 64 points (and fs to 128 kHz), with all other factors the same, leads to the following results (the true integral value is unchanged):

Trapezoidal error using n=64: −9.8e-08
Romberg Integration error using 5 stages: −2.7e-15

These examples illustrate the RI technique and its powerful ability to reduce integration error. The next question is to consider how RI can be applied to sliding windows of data for efficient real-time computation.

Conventionally, RI is applied to a numerical function, usually computer coded, where the integration procedure is able to evaluate the function at any point along the axis of integration. Typically, some threshold for accuracy is selected, and the RI process is continued until the latest best estimate of the integral value is seen to converge to within the selected accuracy threshold. Thus function evaluations are carried out to supply intermediary values to complete trapezoidal integrals for n=1, 2, 4, 8, . . . . At each stage the Romberg calculation is extended to include the latest trapezoidal integral value, and a test for convergence is applied. Thus in the default approach, the RI process starts from the smallest n value and increases n until the convergence criterion is met.

For Prism integration, RI is applied to a time series of samples: these are the only positions along the axis of integration for which function data is available. The sample interval, 1/fs, and the integral period 1/m, are both fixed. The highest sample density over the integral period is given by using $n_{max}$=fs/m. To apply the RI process, one approach might be to evaluate trapezoidal integrals for lengths $n_{max}$, $n_{max}/2$, $n_{max}/4$, etc proceeding from the maximum number of samples downwards until the desired level of accuracy is achieved.

However, the biggest difference between a conventional RI application and its use in Prism signal processing is that in the latter case the calculation is to be repeated each time a new sample is added to the time series, over another window of data which has simply advanced one sample compared with the previously calculated result. The subsequent integration period will have a largely identical data set compared to its predecessor, with only the oldest sample to be excluded and with only the newest sample to be included. Given the large overlap of data between consecutive integrations, it is clearly desirable to find a form of RI that maximises the reuse of calculation between updates (i.e. that is recursive).

Note first that, as discussed above, an embodiment of the Prism may be designed to allow operations where the previous products of signal value and modulation function to remain valid rather than having to be recalculated each sample. This idea can be illustrated by reconsidering the plot in FIG. 3. This shows the signal, the corresponding modulation function and their product, over the interval to be integrated. When a new sample from the signal is received, to update the Prism integral value all that is required is for the new signal value to be multiplied by the next in the sequence of modulation values, and for this new product value to be included in the new integral. All but one of the previous product values remain valid, so that the new integral calculation need only remove the oldest product value and include the newest product value, thus achieving the efficiencies afforded by using a recursive calculation. Without this capability, the product would have to be recalculated for the entire window of data with the arrival of each new sample, rendering the technique unworkably burdensome.

Accordingly, it is assumed from here onwards that a new 'datum' corresponds to the product of signal and modulation function, and it is this sequence of data that requires integration using the Romberg procedure.

The RI algorithm can be broken down into two parts:
1) Generating a series of trapezoidal integral values
2) Generating improved estimates using the RI formula With regard to the second part, the trapezoidal integral values change every sample, and so the application of the RI formula must be fully applied each time step. However, the first part, in which the trapezoidal integral values are evaluated, can be made efficient through the use of a recursive sliding window technique.

Figure 8:
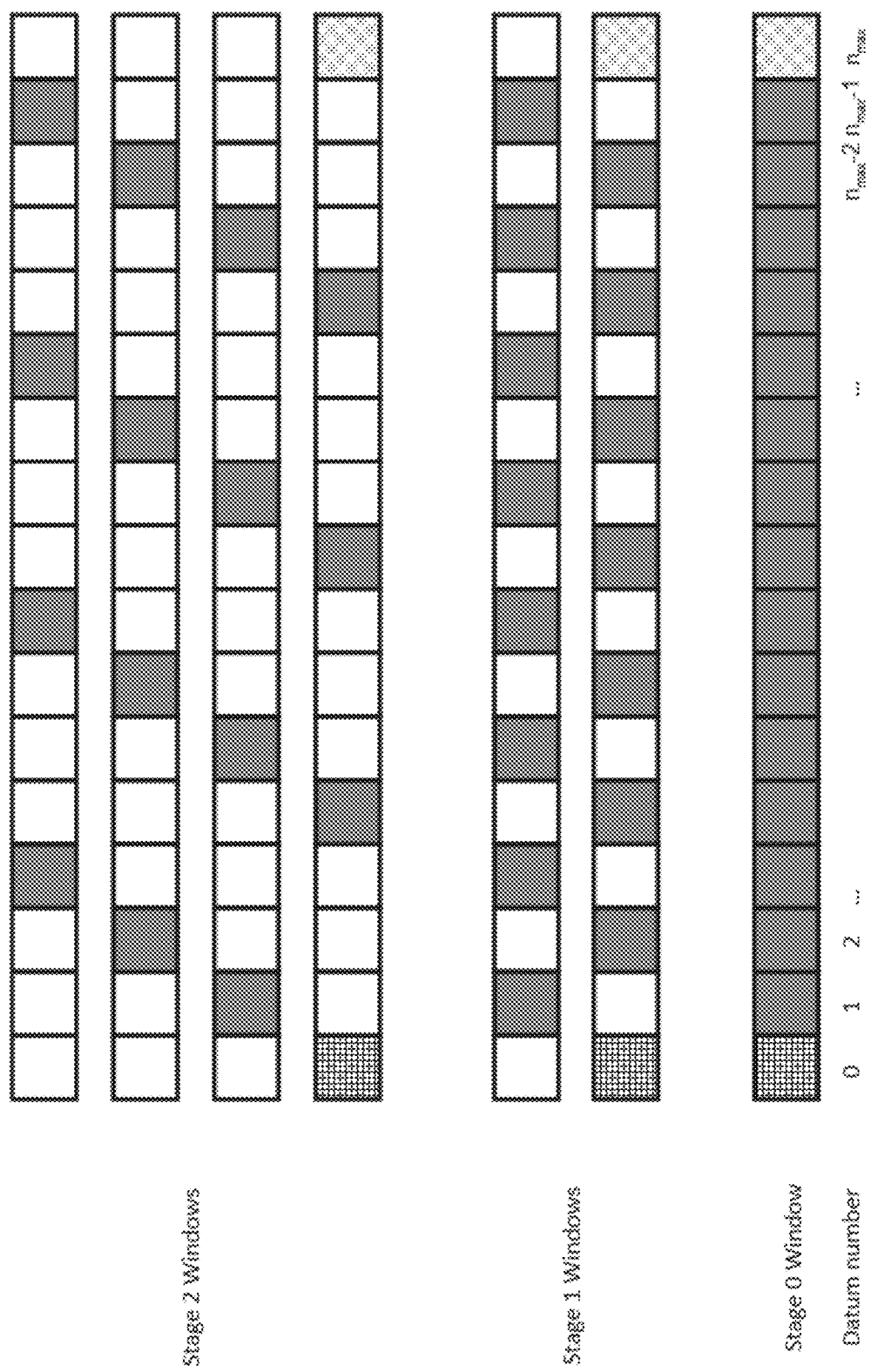
FIG. 8 is an exemplary schematic view of an embodiment of a Romberg Integration technique applied to a regularly sampled time series over a fixed window length.

FIG. 8 (graph 80) illustrates the requirement for a sliding window approach to trapezoidal integration for integrals of length $n_{max}$, $n_{max}/2$, and $n_{max}/4$. Lowest in the figure, the Stage 0 data window is straightforward. It contains all points from 0 to $n_{max}$, including the newest datum (square filled with dots), which has a datum number $n_{max}$, and the oldest datum (square filled with a mesh) with datum number (or index) 0. For Stage 1, which uses $n_{max}/2$ points, only alternative data points are used in the integral. This means that each datum is included in only every other integral as the time series progresses. 'Included' data are shaded in grey for the Stage 1 windows. Thus two parallel sliding windows are required, each containing alternative data (the equivalent of 'odd' and 'even'). Only one of the windows, the one currently containing both the oldest and newest data, is used to generate the current trapezoidal integral for Stage 1, while the other window becomes active on the next time step. Similarly, for Stage 2, four sliding windows are required. Only one in every four data items are 'included' in each window—shaded grey in FIG. 8—and only one window, containing the oldest and newest data, is used at each time step.

On completion of the processing of the current time step, the oldest datum is dropped from all windows, which are then shunted to the left. When the next datum arrives, for each stage, the window with what has become the oldest included datum will become the new active window. Thus, at each stage, each window becomes active in turn.

Figure 9:
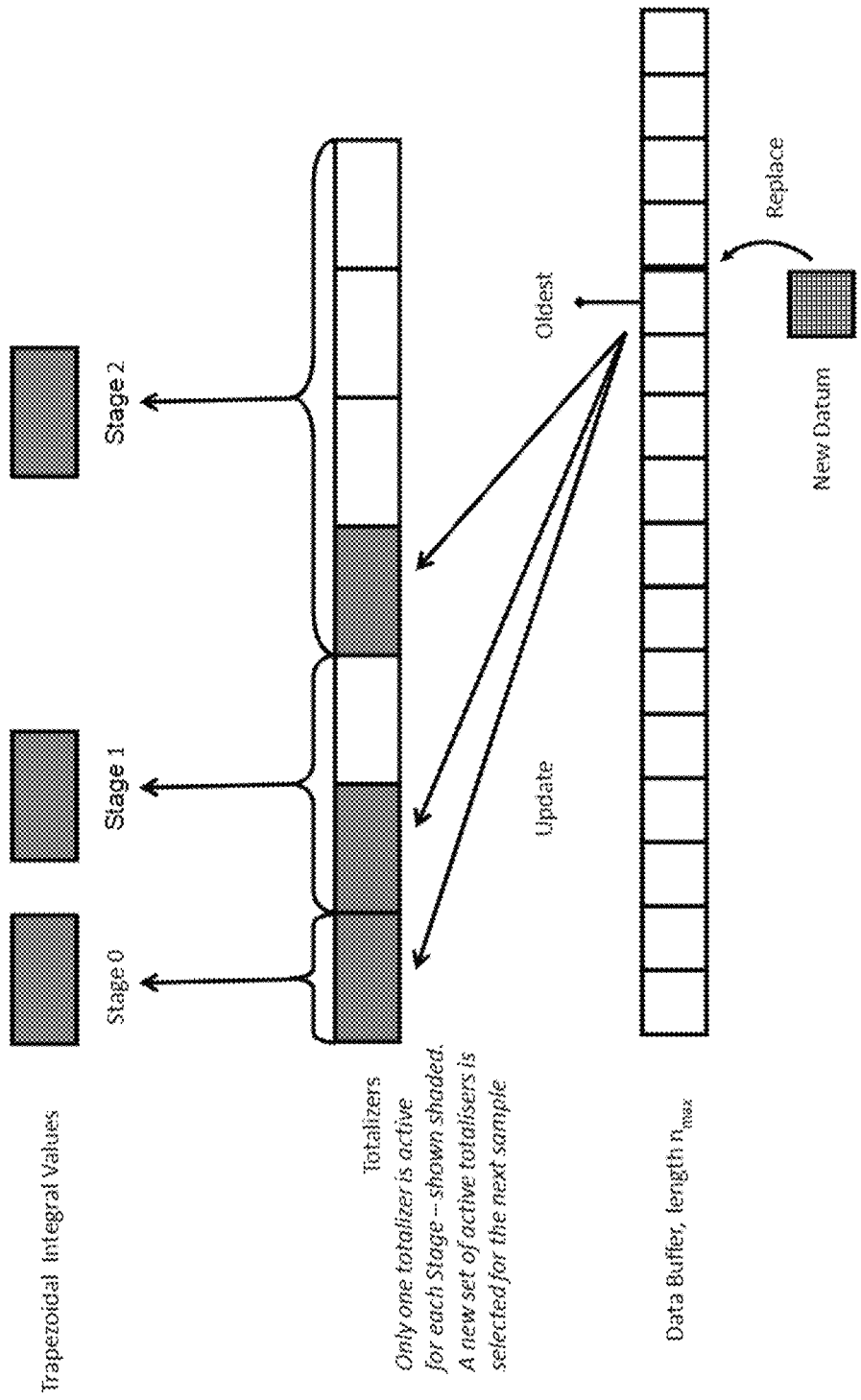
FIG. 9 is an exemplary schematic view of an embodiment of a Romberg Integration technique applied to a regularly sampled time series over a fixed window length, implemented using totalizers (registers).

Having illustrated the basic principle in FIG. 8, a more practical implementation 90 is shown in FIG. 9. As trapezoidal integration essentially consists of summation, with half weighting for the start and end points, each of the windows shown in FIG. 8 can be instantiated as a simple totalizer (register) to which datum values can be added and from which datum values can be subtracted. When a new datum is to be 'included' in a window in FIG. 8, this is equivalent to simply adding the new datum value to the corresponding totalizer in FIG. 9. When a new datum is not to be included in a window, its value is simply not added to the corresponding totalizer. When the oldest datum is to be removed, its value is subtracted from each totalizer in which it has previously been 'included'.

Where totalizers are used in this manner as a convenient replacement for the windows shown in FIG. 8, then only a single buffer may be required to store the complete set of datum values. This is illustrated at the bottom of FIG. 9 with the presence of a single Data Buffer. In the arrangement shown, this data buffer is of length $n_{max}$ points (compared with the $n_{max}+1$ values shown in FIG. 8, with Datum numbers 0 to $n_{max}$); the separate variable labelled New Datum (and filled with a mesh) provides the final datum to complete the $n_{max}+1$ values. The buffer operates in a circular manner, with the index of the oldest value incremented modulo $n_{max}$ after each time step. Totalizers are provided for each stage: one totalizer for Stage 0, two for Stage 1, four for Stage 2, and so on. If the number of Stages is n_stages, indexed from 0 to n_stages−1, then in all $2^{n\_stages+1}-1$ totalizers are required. The trapezoidal integral value for each stage is calculated using the active totalizer for that stage (shaded in grey) and the values of the oldest and newest data. Each active totalizer is updated by subtracting the oldest datum and adding the newest datum. The new datum replaces the old datum in the data buffer. Finally, the index to the oldest datum is incremented (modulo n_stages), and its value may be used on the next time step to identify the active window or totaliser for each Stage.

The Romberg Integration algorithm technique, as modified here to be applied to a sliding window, uses a recursive calculation to find the updated value of the integral. The recursive element, which provides efficient calculation, comes from the totalizers: instead of summing all of the elements at each step, all previous summation calculations are retained in the totalizers, and only the oldest value is removed and the newest value is added. This in turn is rendered possible because there is no need to rework the multiplication of each signal value in the window by a modulating function value, due to the mathematical formulation of the Prism. Accordingly, the computational requirement to update a Prism integral with a new sample is essentially independent of the window length.

Nevertheless, the Prism integration calculation can qualify as being Finite Impulse Response: once a datum leaves the integration window, it has no further impact on the output value of the Prism. However, the Prism can have an advantageous difference to the conventional FIR filter, with a window length of n samples, which typically requires n multiply-and-accumulate (MAC) operations per sample update. With some embodiments of the Prism, only one MAC is required for each integration stage (for example, blocks 12-17 in FIG. 1), where the newest value supplied to each integral must be multiplied by the appropriate modulation function value. Thus if only one of $G_s$ and $G_c$ are produced, then four multiply and accumulate operations are required (because only four integrals in FIG. 1 may be used), while if both Prism outputs are produced, then six multiply and accumulate operations are required (because all six integrals in FIG. 1 may be used), again irrespective of the Prism window length.

The 'accumulation' stage associated with a Prism integral is more elaborate than for a conventional FIR filter, though not necessarily more computationally demanding for moderate to long window lengths. The primary factor affecting the computation load of the 'accumulation' is the number of Romberg Integration stages that are applied in the calculation. When dealing with noise free signals, 4 RI stages generally provides the highest accuracy obtainable with double precision arithmetic. However, with typical levels of noise associated with conventional signal processing, for example with the Signal-to-Noise Ratio (SNR) in the range 0 dB-120 dB, little or no further improvement is often obtained after applying only a single stage of Romberg Integration.

One potential limitation of the recursive calculation used in the Prism, commonly cited with as a drawback for other recursive calculations such as IIR filters, is the accumulation of rounding error. In the case of the Prism implementation discussed above, this can occur in the totalizers. As is well known to those familiar with the art, floating point calculations are not always exact, and a totalizer in which floating point numbers are continuously added and subtracted may, over time, accumulate rounding error, which may have a detrimental impact on the accuracy of the corresponding results. One means of counteracting this potential difficulty when instantiating Prism calculations is as follows. After a new input value has been multiplied by the required modulation value, the resulting product can be mapped onto an integer scale, for example by mapping the values −1.0 . . . 1.0 (say) Volts onto a signed (say) 63 bit integer, in order to provide a high precision but fixed point (i.e. effectively integer) representation of the original product value. Note that the modulation functions used in the Prism, being sinusoidal, are well suited to applying such a scale, because the magnitudes of most of the sinusoidal values are similar. This contrasts with the coefficients of other types of filter which may vary by several orders of magnitude, and are therefore less easily represented on a fixed point scale while retaining high accuracy. Having mapped individual product values onto a fixed point or integer scale, the totalizers can be implemented as longer integer values, for example using 96 or 128 bit integers, as determined by the length of the Prism window and the need to avoid calculation overflow. Using this arrangement, the addition and removal of data from the totalizers becomes an integer calculation and therefore exact, so that the accumulation of rounding error is avoided. This advantage comes at the computational cost of mapping the data to and from the fixed point or integer scales, but may prove beneficial where high accuracy is required and/or long filter windows are being used. An alternative means of avoiding the accumulation of rounding error in the totalisers may be to recalculate the value of each totaliser from the data buffer on an occasional basis. It will be noted that the data buffer values are product with low rounding error. Recalculating each totaliser value from the corresponding values in the data buffer thus acts as a means of removing accumulated rounding error. The average computational burden of doing such totaliser recalculation may be acceptably low if it is performed with low frequency, for example once every 100,000 samples.

The Prism as a Filter

As implied earlier, embodiments of the Prism may be used as a filter. Each Prism generating an output, for example $G_c$ and $G_s$, can be viewed as a form of FIR filter, with corresponding properties, for example gain and phase characteristics, which can be compared with well-known filter types. However, some embodiments of the Prism also have a number of distinct advantageous characteristics not generally shared with state-of-the-art FIR filter types.

The phase properties of the Prism outputs have already been discussed. Both sine and cosine terms in Equations 14 and 15 have a common delay term $2\pi r$. This is the linear phase delay characteristic of an FIR filter where the time delay is $1/m$. Thus the Prism retains the advantage of linear phase shift that is recognised by one familiar with the art as a reason to use FIR over IIR filtering techniques.

Gain terms can be defined as follows:

$$\Gamma_{s_h}(r) = \mathrm{sinc}^2(r)\frac{r^2}{r^2 - h^2} \text{ and} \qquad \text{Equation (22)}$$

$$\Gamma_{c_h}(r) = \mathrm{sinc}^2(r)\frac{hr}{r^2 - h^2}. \qquad \text{Equation (23)}$$

where $\Gamma_{s_k}(r)$ is the gain of the Prism output $G_s$ with harmonic number k, and similarly $\Gamma_{c_k}(r)$ is the gain of the Prism output $G_c$ with harmonic number k. Here the gain is formed by simply removing the sinusoidal component of the output from Equations 14 and 15, and determining the amplitude of the output signal given a unit input amplitude (i.e., A=1.0). FIGS. 10A and 10B show exemplary plots of $\Gamma_s(=\Gamma_{s_1})$, $\Gamma_c(=\Gamma_{c_1})$, $\Gamma_z(=\Gamma_{s_2})$, and $\Gamma_k(=\Gamma_{c_2})$ respectively. The upper graph 100 shows the gain against frequency of each function on a linear scale, while the lower graph 102 shows the magnitude (i.e. taking a positive value only, ignoring the sign) of the relative gain on a logarithmic scale. In these graphs and elsewhere in these disclosures, the relative gain may be defined as the ratio of the true gain to some nominal value, typically the maximum (absolute) gain of the function concerned. The relative gain is a useful for analysing for example the reduction in gain with frequency. In each case the y axis gives frequency as a multiple of m, the characteristic frequency of the Prism.

The depicted Prism gain functions have notches at integer multiples of m. In other words, the gain approaches zero at those frequencies. Regular notches are a common feature of filters, for example the Equiripple filter known to those familiar with the art. The Prism gain functions show a similar characteristic of some conventional low-pass filters, in that the gain generally drops with increasing frequency. For example, in the case of $G_c$, the relative gain drops from a maximum of 0 dB around m/2 Hz down to below 40 dB at frequencies above 3.5m Hz. In the cases of $G_s$ and $G_c$, the gain is negative for frequencies below m Hz, and then positive thereafter. For $G_z$ and $G_k$, the change in sign occurs at 2m Hz. In the case of $G_z$, the maximum magnitude occurs between m Hz and 2m Hz, rather than below m Hz.

However, in other respects, some embodiments of the filters using Prism methods and systems differ from prior art FIR filtering techniques, as follows:

1) As described above, the Prism filters are generally recursive, requiring a generally constant computational effort irrespective of the length of the filter. This is a significant advantage over conventional FIR filters.

2) Compared with most prior art filters, the design options for Prism methods and systems appear limited. Effectively there are only two parameters that can be selected, and each of these are integers: the harmonic number, and the length of the filter in samples (alternatively, the value of m given the value of fs, or vice versa). This contrasts with the wide range of prior art filter characteristics, such as band pass ripple, cut off frequency, stop band attenuation, etc. that can be selected when designing conventional filters. However, this apparent limitation results in a particular and substantial advantage, which is that Prism methods and systems can be simple to design. No sophisticated or computationally expensive design software is required in order to implement a Prism method or system, as the Prism utilizes coefficients which are readily calculated linearly-spaced sine and cosine values. Not only does this reduce the design effort and expertise required to develop Prism-based systems in the conventional way (for example when designing a new product), it also makes possible real-time implementation of new Prism-based method filters within field devices in order to match the observed (or evolving) properties of the actual signal being processed and/or tracked. This offers the possibility of more adaptive, self-learning, autonomous devices, for example operating in the Internet of Things.

3) Some Prism methods and systems may not be considered true low-pass filters, as conventionally defined, because the gain at zero Hertz (i.e., the DC gain) is always zero. One indirect consequence of this property is that DC as a noise source can usually be discounted in Prism signal processing. More generally, the Prism does not attempt emulate the "ideal brick wall filter" known to those familiar to the art, by aiming for the minimal variation in passband gain, the maximum attenuation in the stop band, and the fastest transition between the two regions. Within the Prism methodology, an important requirement is to create a fully recursive calculation in order to minimize the computational requirement, especially for long filters. Other design requirements are to have linear phase shift, a simple analytic form for the gain, and the provision of orthogonal (i.e. sin/cos pair) outputs $G_s$ and $G_c$ to facilitate sinusoid tracking, as discussed below.

Given the different design priorities of the Prism over conventional FIR filters (such as the requirement for recursive calculation), it is perhaps unsurprising that there is less control over the filtering characteristics of a Prism. For example, the gain changes relatively rapidly with frequency, even throughout what may be considered the 'passband', where conventionally it is considered desirable to have a flat passband. Note however that the variation of gain within the passband facilitates the powerful technique of dynamic filtering which would not be possible with a flat passband. Similarly, the Prism filter roll-off (i.e., the reduction in gain with increasing frequency in the transition and/or stopband region) is fixed, for a given value of m and harmonic number h.

The relative inflexibility in Prism filter design can be addressed by creating a chain (or more generally a network) of Prisms, which together can provide a wider range of filtering performance than is possible from an individual Prism. This approach has the advantage of retaining the distinctive Prism characteristics while offering greater design flexibility. In addition, Prism chains or networks can be adapted by adding, changing or removing Prisms as the characteristics of the monitored signal are observed to change over time. The cost of using a Prism chain is the additional computation burden associated with evaluating multiple Prisms, as well as the additional delay associated with propagating a signal through several Prisms.

Prism-Based Signal Trackers

In addition to its application as a type of FIR filter, the Prism can be used for tracking sine waves (i.e., generating estimates of the frequency, phase and/or amplitude values of one or more frequency components in a possibly noisy signal).

Hereafter the term 'signal tracker' (or simply 'tracker') is used to describe a Prism-based signal processing block which generates estimates of frequency, phase and/or amplitude from a potentially noisy signal containing typically, but not exclusively, a single sinusoidal component. A signal tracker comprises a Prism network, itself comprising one or more Prisms, together with a calculation block which uses the Prism outputs and possibly other information to calculate the estimates of the sinusoid parameters.

Trackers can be used in combination with other Prisms, Prism chains or Prism networks, for example to provide signal pre-filtering such as low-pass, band-pass, and/or notch filtering. More generally, trackers can be used to track individual signal components, as part of a larger Prism signal processing network tracking a multi-component signal, where individual components are first isolated using Prism filtering or other techniques.

The Recursive Signal Tracker

One general approach for developing Recursive (i.e. IIR) Prism-based trackers is as follows. In general, when both the $G_{s_h}$ and $G_{c_h}$ outputs of a Prism are generated (Equations 14 and 15), if the value of r is known (and it can be assumed that h and m are known), then the values of f, A and $\phi$ may be calculated in a straightforward manner, using, for example a root-sum-square calculation of A and an arctangent calculation of $\phi$; note also that f is simply the product of r and m. See Equations 24-28 below for examples of such calculations. An additional relationship that can be employed to calculate or correct the value of r is the well-known dependency between frequency and phase: namely that frequency is the rate of change of phase with time. More simply put, assuming a constant frequency over a given time period, then the frequency may be calculated as the change in phase over the time period, divided by the duration of the time period, where appropriate steps are taken to manage any phase wrap-around (i.e. $\pi \to -\pi$) that may occur during the time period.

This leads to the following general approach:
1) Assume an initial estimate of r (for example, a guess, or based on a previously calculated value of r or f)
2) Based on this value of r, calculate the current value of the signal phase, and also a value of phase for an earlier time. Note that this stage requires storing previous values of $G_{s_h}$ and $G_{c_h}$.
3) Given these two values of phase, and the known time interval between them, calculate a revised estimate of f, and hence r.
4) If the new value of r is significantly different from the original estimate, repeat stages 2 and 3, starting with the new estimate of r, until convergence is achieved for the new estimate of r.

Figure 11:
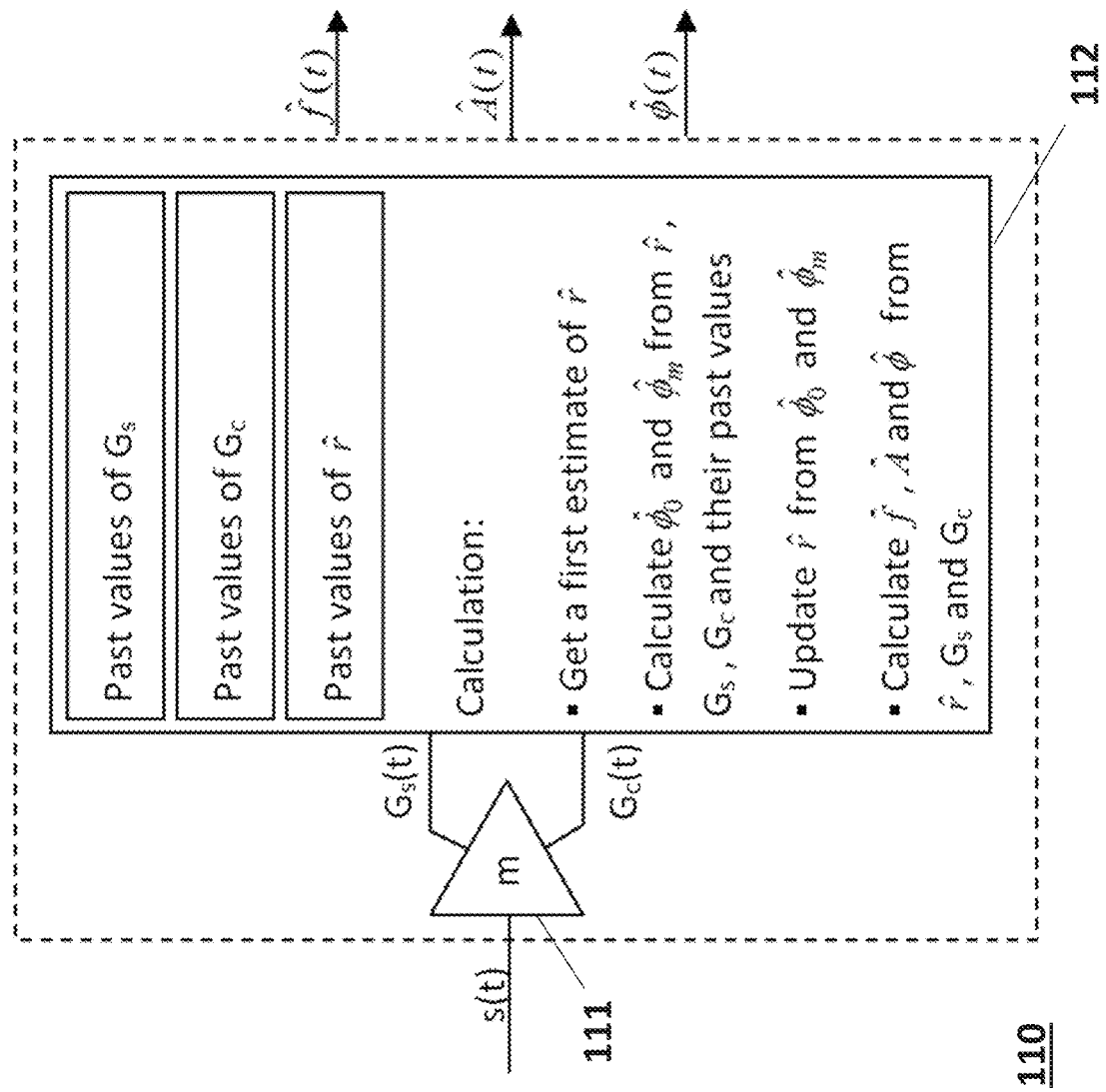
FIG. 11 is an exemplary schematic view of an embodiment of a Recursive Signal Tracker analyzer, employing one disclosed Prism from FIG. 1 operating with an analyzer to calculate estimates of the sinusoidal parameters of an input signal.

FIG. 11 is an illustrative example of an IIR tracker. This embodiment of a Recursive Signal Tracker (RST) 110 uses a single Prism 111, with harmonic number h=1, to generate output values $G_s$ and $G_c$ that are passed to block 112. Past values of $G_s$ and $G_c$ are stored in a vector, for example implemented as a circular buffer of fixed length, while at least one past value—typically the most recent—of the estimate of r, labelled $\hat{r}$, is also stored in block 112. Equations and other notations in block 112 and below are for this embodiment only and do not limit the disclosure.

For the purposes of explaining the operation of the RST 110, the current or latest values of the Prism output are labelled $G_{s0}$ and $G_{c0}$. While a variety of storage lengths may equally be used in the RST, it may be mathematically convenient to use previous values of $G_s$ and $G_c$ from 1/m seconds earlier: these values are labelled $G_{sm}$ and $G_{cm}$. Note this arrangement implies that the circular buffers for storing earlier values of $G_s$ and $G_c$ may have the same length as the integrals used within the Prism. Other buffer lengths and/or time intervals may be considered, requiring modifications to the equations given below, and resulting in tradeoffs between accuracy and dynamic response.

Given the current and previous values of $G_s$ and $G_c$, and assuming an initial estimate of r as $\hat{r}$, then current and past estimates of phase are given by the following:

$$\hat{\phi}_0 = a\tan 2(G_{s0}, \hat{r} G_{c0}) + 2\pi \hat{r} \qquad \text{Equation (24)}$$

$$\hat{\phi}_m = a\tan 2(G_{sm}, \hat{r} G_{cm}) + 2\pi \hat{r} \qquad \text{Equation (25)}$$

A new estimate of r can be calculated using:

$$\hat{r} = (\hat{\phi}_0 - \hat{\phi}_m)/2\pi \qquad \text{Equation (26)}$$

where, as previously discussed, care is taken to deal with phase wrap-around issues: here the desired range of the calculated phase difference is [0, 2π] in order to provide a [0,1] range of values for $\hat{r}$. More generally, if the time interval over which the calculation takes place is longer than the period of the input signal, care must be taken to ensure the calculated phase difference includes the correct number of whole cycles (i.e. multiples of 2π) to ensure the frequency calculation is performed correctly. Note also that, for the purposes of computation efficiency, the term $2\pi\hat{r}$ in equations (24) and (25) may be excluded for the purposes of calculating $\hat{r}$ in equation (26), as long as the term is restored for the final calculation of $\hat{\phi}_0$, as discussed below.

Equations 24 to 26 may be repeated as often as deemed necessary in order to achieve convergence in the value of $\hat{r}$. Corresponding estimates of f and A may then be calculated as follows:

$$\hat{f} = \hat{r}m \qquad \text{Equation (27)}$$

$$\hat{A} = \left[\frac{\pi}{\sin(\pi\hat{r})}\right]^2 [1-\hat{r}^2]\sqrt{G_s^2 + \hat{r}^2 G_c^2} \qquad \text{Equation (28)}$$

while the best estimate of phase is given by the latest value of $\hat{\phi}_0$ calculated in Equation 24.

An important consideration is whether the iterative estimation of $\hat{r}$ generated by repeated application of Equations 24 to 26, is likely to be convergent. A related question is as follows: when an RST is initialized and there is no earlier estimate of $\hat{r}$, how is an initial estimate to be selected, and what are the convergence properties in this case? Simulation studies suggest that, over the range r∈[0.1, 0.9], the iterative calculation is, on average, likely to converge on the true value of $\hat{r}$, because any initial error will be reduced in a subsequent iteration.

While a range of different strategies may be applied for initialization and iteration of the r calculation, the following simple strategy has been used in the examples which follow. On initialization, a first estimate of r=0.5 is selected and two iterations are applied to the first sample with complete data (i.e. as soon as the past history vectors for $G_s$ and $G_c$ are filled for the first time). On subsequent samples, the most recent estimate of r is used as the starting point, and a single iteration is applied. An important alternative approach, which would maintain a strictly FIR characteristic of the tracker, would be always to restart the estimate of r at a fixed value, for example 0.5, and iterate to convergence every sample. However, this strategy would be more computationally expensive, especially for low values of r for which many iterations may be required.

The generally efficient error reduction properties of this method for values of r close to 0.5 provides one motivation for an approach to sinusoidal tracking as follows. When a sinusoid is being tracked and the value of r is not reasonably close to 0.5 (where suitable bounds, for example r<0.4 or r>0.6, may be selected as required for the particular application), it may prove advantageous to instantiate new Prism-based signal processing blocks where the newly selected value(s) of m result in corresponding values of r close to 0.5, in order to reduce tracking error.

Figure 12:
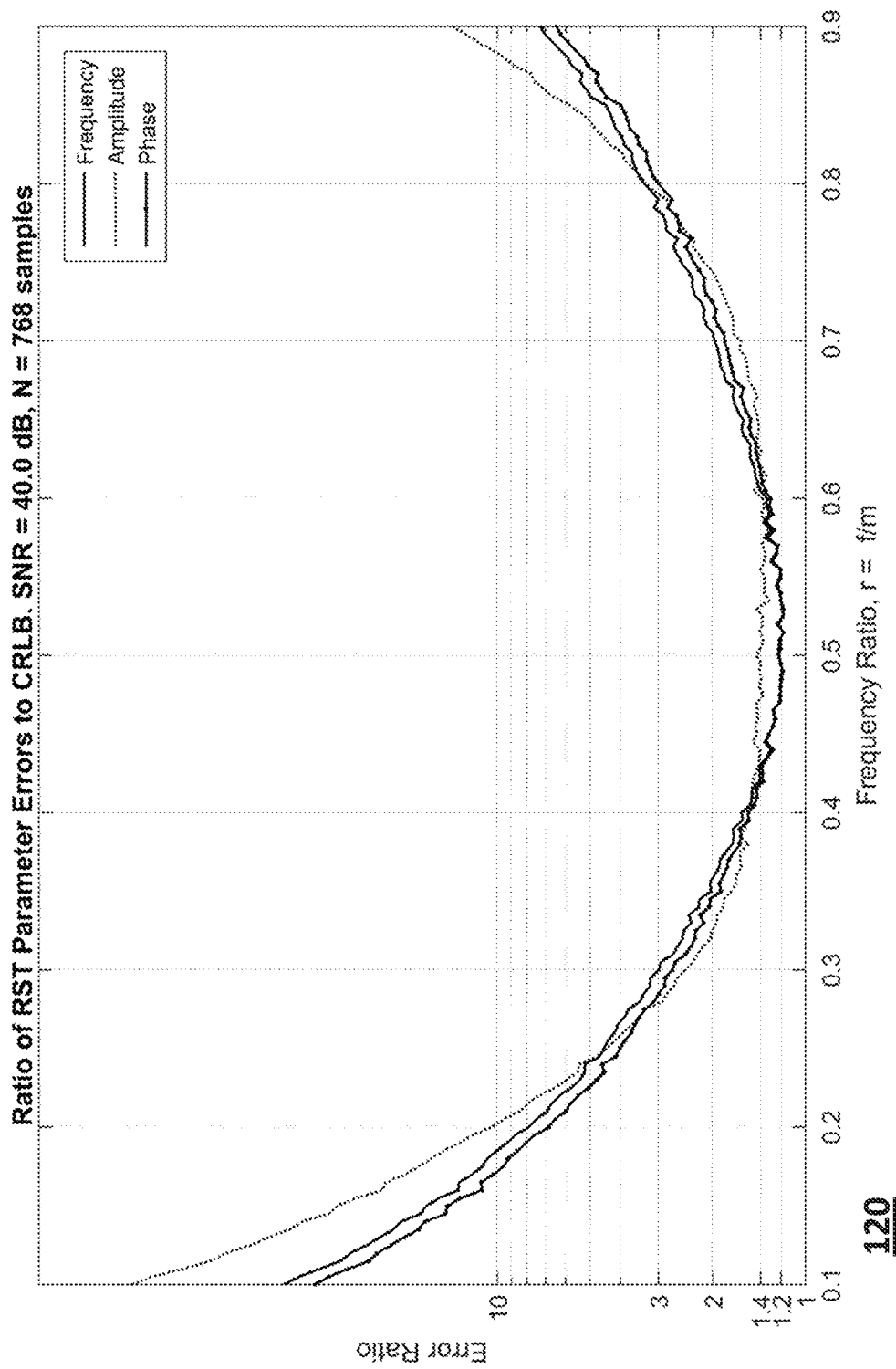
FIG. 12 is an exemplary graph showing the ratios of the sinusoidal parameter errors obtained from the Recursive Signal Tracker in a simulation, to the corresponding Cramér-Rao Lower Bounds, for different values of the Frequency Ratio, r, with a signal to noise ratio of 40 dB.

The Cramér-Rao Lower Bound (CRLB) is widely used in signal processing to determine the 'best' (i.e. smallest variance) performance theoretically achievable when extracting a parameter value from a data set contaminated by white noise. The CRLB provides a useful means of comparing the performance of parameter tracking techniques against their theoretical limits, for example using simulation studies, where the true parameter values are known exactly and can be held constant. Those skilled in the art will recognize that a good parameter tracking technique will generate parameter estimate variances close to the CRLB limits. It is further recognized that a technique that successfully remains close to the CRLB when using only short data sets, and/or one which performs well in the presence of high levels of white noise compared with the amplitude of the desired frequency component (i.e. with a low signal-to-noise ratio SNR), is also considered advantageous The RST performance as a sinusoidal tracker compared with the CRLB has been evaluated for a SNR ratio of 40 dB, sample rate fs=51.2 kHz and m=200 Hz, so that the number of samples used, N, is 768. This is based on the two integral windows in the Prism, of 256 samples each, plus the window of old $G_s$ and $G_c$ values, which has a length of 256 samples in this case. FIG. 12 (graph 120) shows the ratio of the RST errors to the CRLB for each parameter. The phase and frequency error ratios track each other closely, achieving roughly 1.4:1 or better for the approximate interval r∈[0.4, 0.6], and dropping to around 1.2:1 close to r=0.5. The RST amplitude achieves a 1.4:1 ratio compared with the CRLB for the approximate interval r∈[0.4, 0.6].

Bandpass Filter Design

Figure 13:
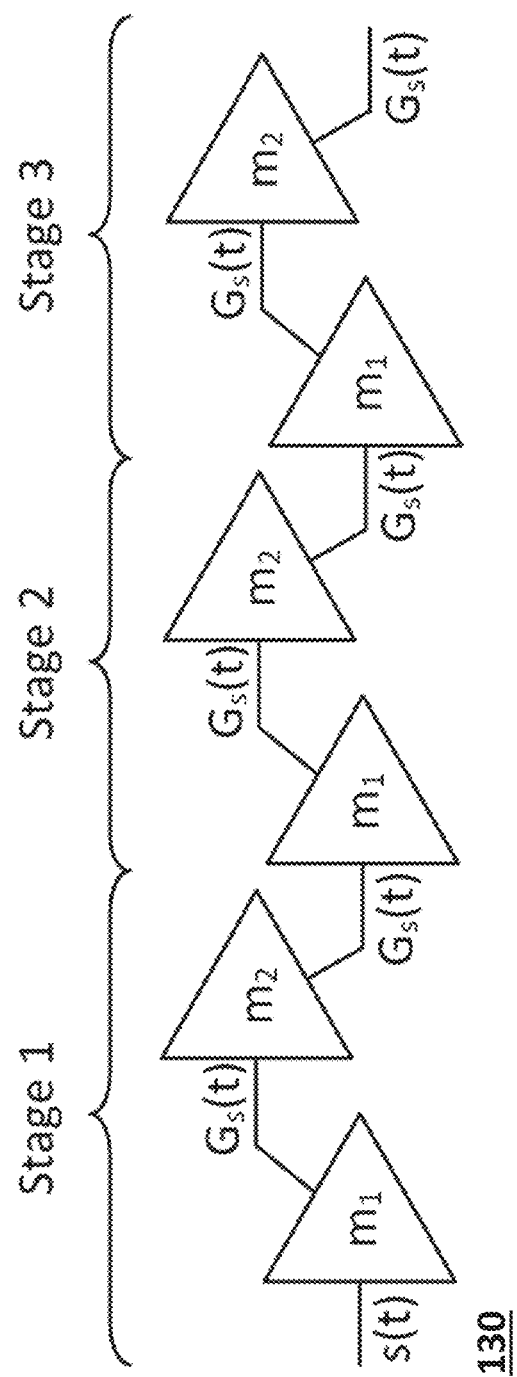
FIG. 13 is an exemplary schematic view of an embodiment of a filter comprising of a sequence of three pairs of Prisms.

Prism chains may be used to create a range of filtering properties. An example is shown in FIGS. 13 to 16 which demonstrate how a true bandpass filter can be created using higher order harmonic Prisms with two different values of m. FIG. 13 illustrates an exemplary arrangement of such a Prism chain 130. Here two different values of m, labelled m1 and m2, are used to provide the desired bandpass characteristics, while the number of stages (i.e., the number of Prism pairs) can be varied based on the tradeoff between computation load and stop band attenuation, both of which increase as more filter stages are added.

A simple exemplary formula may be used for the generation of the bandpass filter, which may be applied when only the Gs output of each Prism is used, and the harmonic number h is set to three. Given a desired central frequency c_f, the value of m1 is set to 0.379×c_f, while the value of m2 is set to 0.2994×c_f. In each case, if the exact desired value of m1 or m2 is not permissible because of the requirements of a whole number of samples in the window length and possibly the use of Romberg Integration, then the nearest permitted value may provide an acceptable bandpass filtering performance. As will be seen, these values of m1 and m2 create peak gains around the selected central frequency for third harmonic Prisms, while attenuating frequencies above and below the peak gain. This formula exploits the characteristic of all Gs functions with harmonic number k greater than one: the (absolute) peak value occurs at a frequency between (k−1)×m and k×m, while the second highest peak occurs between k×m and (k+1)×m. Values of m1 and m2 are therefore selected to generate these two peaks close to the central frequency so that, when the two Prisms are combined in a chain, they reinforce the frequencies close to the central frequency, but attenuate all other frequencies, in order to create a single peak.

Figure 14A:
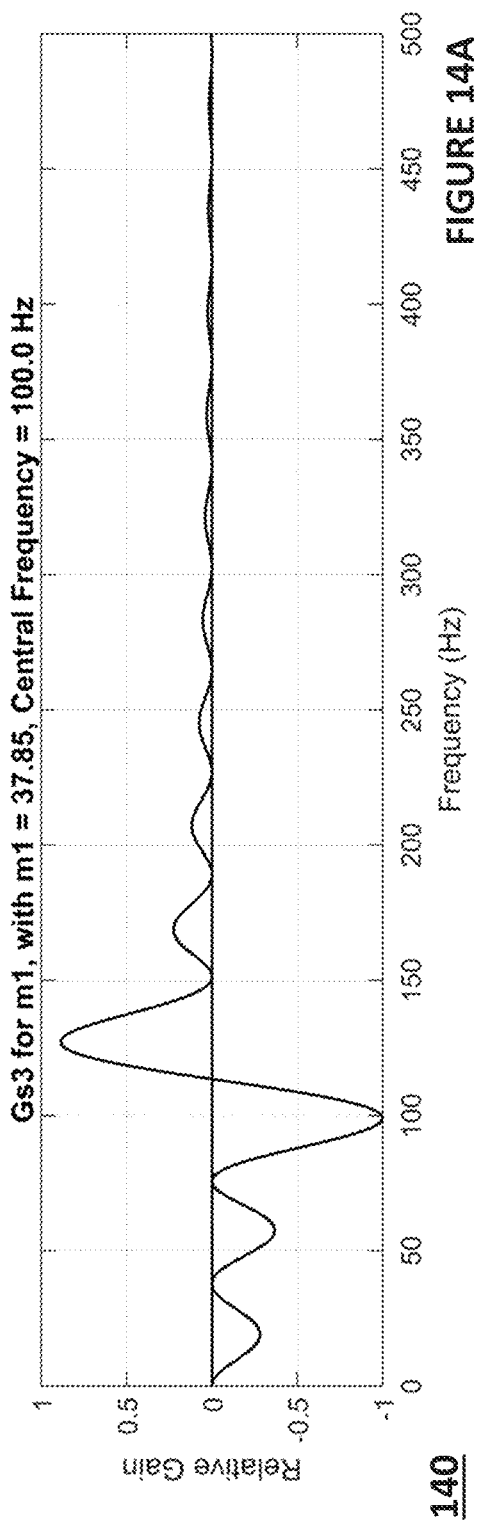
FIG. 14A is an exemplary graph showing how the gain of the function Gs, with h=3 and m=37.85 Hz, varies with frequency on a linear scale.
Figure 14B:
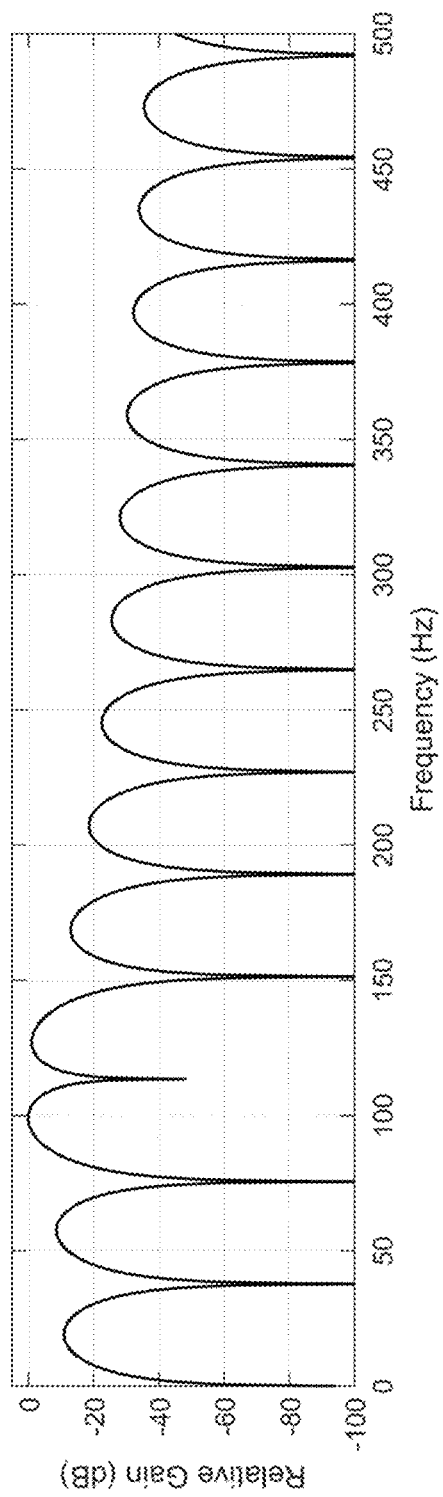
FIG. 14B is an exemplary graph showing how the magnitude of the relative gain of the function Gs, with h=3 and m=37.85 Hz, varies with frequency on a logarithmic (decibel) scale.

FIGS. 14A and 14B (graph 140 and graph 142) give an illustrative example of applying the formula above, where the desired central frequency is set to 100 Hz, and where it is assumed that the sampling rate is 48 kHz and that a single stage of Romberg Integration will be applied. Accordingly, the nearest valid value of m1 is 37.85 Hz, and Graph 140 and graph 142 show the relative gain of the corresponding third harmonic Prism output, Gs. on linear and decibel scales respectively. The maximum (negative) value of the gain occurs close to the desired central frequency of 100 Hz. FIGS. 15A and 15B (graph 150 and graph 152) show the corresponding gain of Gs (with h=3) for the nearest valid value of m2, which is 29.93 Hz. In this case the maximum (positive) value of the gain of Gs (with h=3) occurs close to the desired central frequency.

FIGS. 16A and 16B (graph 160 and graph 162) show the frequency response of the Prism chain filter of FIG. 13, when the above values of m1 and m2 are used, over three filter stages comprising of six Prisms in total. Graph 160 shows that an effective bandpass filter has been created, with a pass band of approximately ±10% of the central frequency, which is 100 Hz in this case. Graph 162 shows that there are side lobes around the central frequency with gains as high as −40 dB. These could be attenuated further by adding extra stages, at the cost of additional computation and phase delay.

Prism Pre-Filtering for Sinusoid Tracking

The sinusoid tracking capability of Prism-based trackers may be extended and improved by using pre-filtering techniques, for example to reduce noise and/or the influence of undesired signal components. One familiar with the art will appreciate that Prism-based trackers can be used in combination with conventional filtering techniques in order to provide pre-filtering. In addition or alternatively, it is possible to use Prism-based filters to provide pre-filtering for a tracker. This approach has the advantages associated with other Prism-based techniques: the low computation burden associated with a recursive FIR calculation; simple, exact analytic expressions for the phase and gain at any frequency; a linear phase shift; and the simplicity and low computational burden of filter design.

Figure 17:
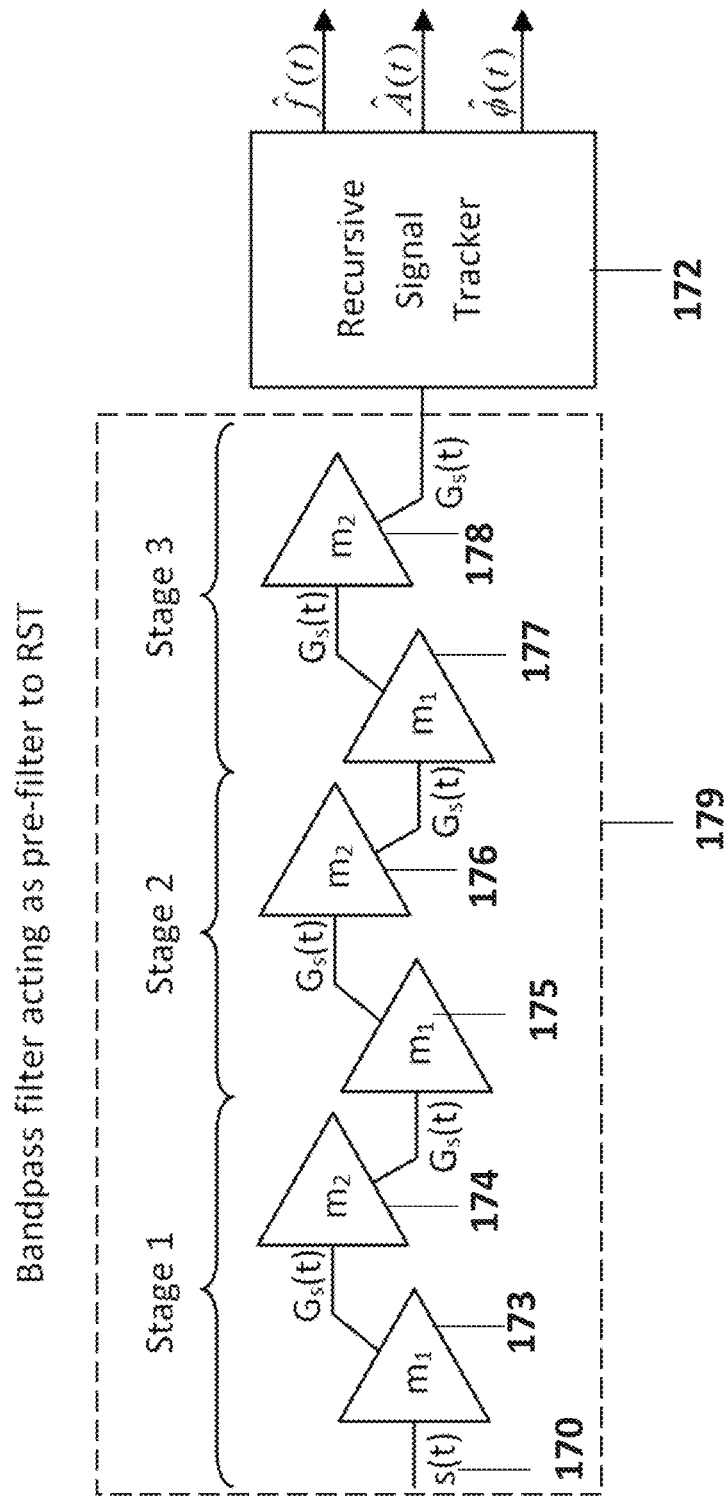
FIG. 17 is an exemplary schematic view of an embodiment of a Recursive Signal Tracker ("RST") in series with a bandpass filter comprising three pairs of Prisms, which acts as a pre-filter to the RST.

The increased robustness to high levels of white noise is illustrated in an example in which a bandpass filter is used as a pre-filter to an RST tracker. FIG. 17 illustrates the arrangement: a three-stage bandpass filter 179 provides pre-filtering for a Recursive Signal Tracker (RST) 172. The bandpass filter 179 design is similar to that shown in FIG. 13 and discussed above. In this example the sample rate fs=192 kHz, the centre frequency of the bandpass filter 179 c_f=10 Hz, and for the RST 172 m=10 Hz. Thus the passband of the bandpass frequency is approximately 10 Hz±1 Hz.

Figure 18A:
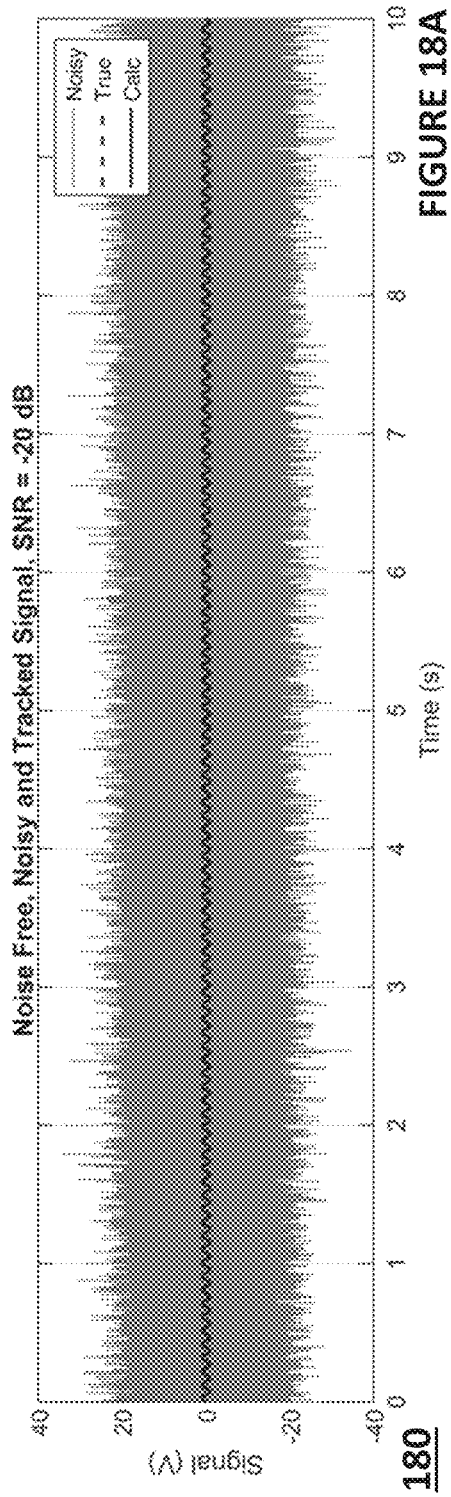
FIG. 18A is an exemplary graph showing three time series from a simulation, in which the RST with band-pass pre-filter shown in FIG. 17 is used to track an input signal consisting of a noisy sinusoid, where both the frequency and the amplitude of the sinusoid are constant. The time series shown are of the noise-free sinusoid, the sinusoid with noise included, and the RST tracked signal. Note that the true value (dashed line) is largely obscured by the tracked value (solid line) as these values largely coincide on the scale of the graph shown.
Figure 18B:
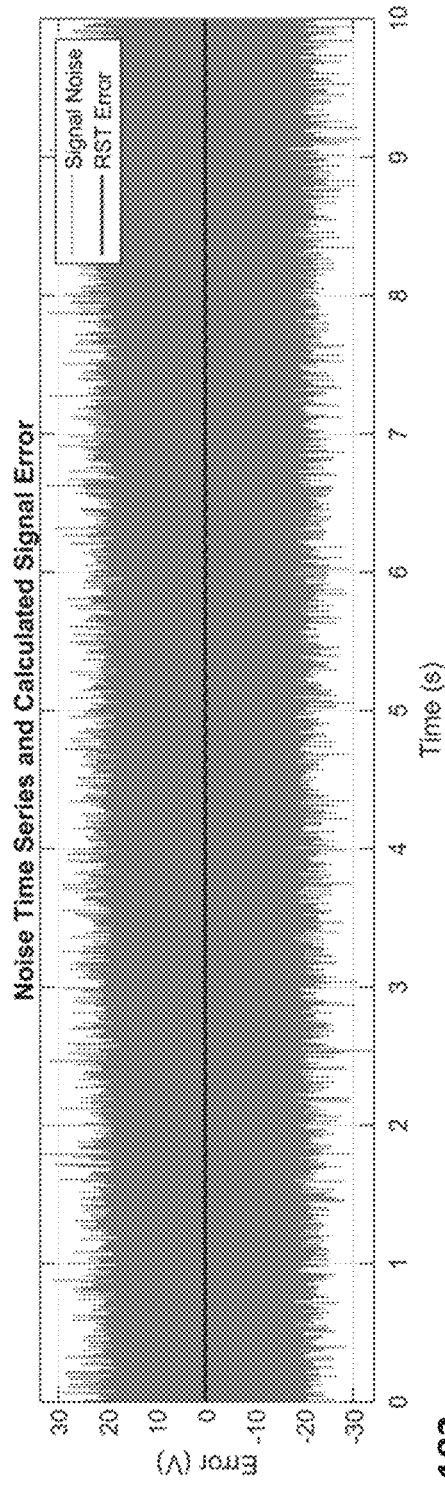
FIG. 18B is an exemplary graph displaying, for the simulation of FIG. 18A, the noise time series and the RST signal error.

FIG. 18A (graph 180) shows the input signal, both with and without noise. The signal-to-noise ratio is −20 dB, indicating that the amplitude of the white noise exceeds that of sinusoid to be tracked by an order of magnitude. The amplitude and frequency of the sinusoid are both constant throughout the simulation, with values of 1 V and 10.2 Hz, respectively, while the instantaneous value of the noisy signal may exceed 20 V. FIG. 18B (graph 182) indicates in general terms the noise reduction achieved by the RST 172 and pre-filter 179: while the unfiltered noise magnitude may exceed 20 V, the error in the RST 172 estimated signal is significantly smaller. The performance is shown in more detail in the following figures. Note that the results shown excluded any required warmup period where the signal processing components are first filled with data.

FIG. 19A (graph 190) shows the power spectrum of the raw (unfiltered) signal, while FIG. 19B (graph 192) shows the power spectrum of the filtered signal i.e. after it has passed through the bandpass pre-filter 179. In each case the relative amplitude in decibels is shown, scaled so that the peak amplitude at 10.2 Hz has an amplitude of 0 dB. In the raw signal, the noise floor is constant at approximately −40 dB, while in the filtered spectrum the noise floor drops rapidly both above and below the peak band, dropping below approximately −80 dB at 100 Hz. The bandpass filter has thus been effective in reducing the signal noise outside the desired passband.

FIG. 20A (graph 200) shows the frequency output of the RST 172, which remains close to the true signal frequency of 10.2 Hz. FIG. 20B (graph 202) shows the error in the RST 172 frequency output, which in the time series shown remains within ±0.015 Hz. The frequency error varies slowly with time, reflecting the dynamic characteristic of the pre-filter 179.

Figure 21A:
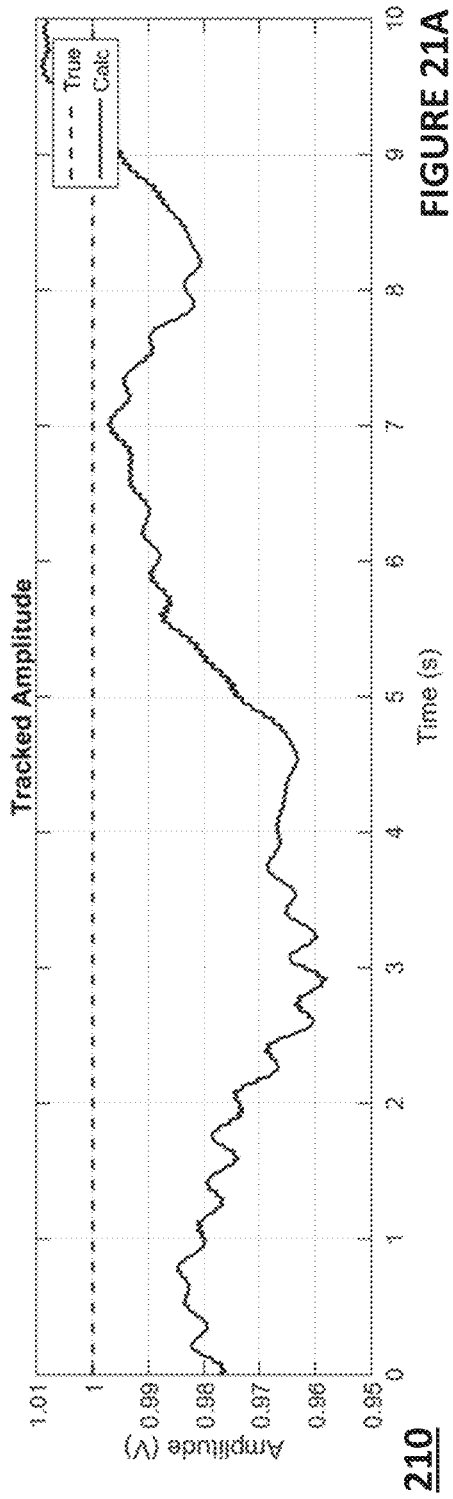
FIG. 21A is an exemplary graph showing the true and RST-tracked amplitude parameter value for the noisy input signal shown in FIG. 18A.
Figure 21B:
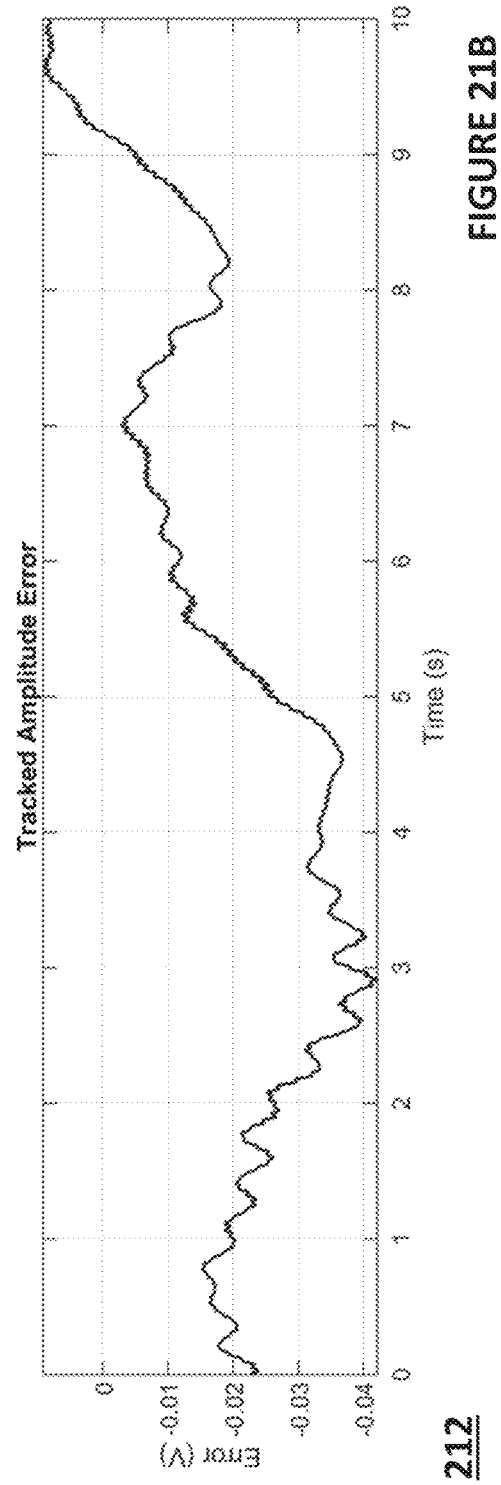
FIG. 21B is an exemplary graph showing the error in the RST-tracked amplitude value shown in FIG. 21A, on a linear scale.

FIG. 21A (graph 210) shows the amplitude output of the RST 172, which remains close to the true signal amplitude of 1 V. FIG. 21B (graph 212) shows the error in the RST amplitude output, which in the time series shown, remains within ±0.05 V. The amplitude error also varies slowly with time, reflecting the dynamic characteristic of the pre-filter 179.

Figure 22A:
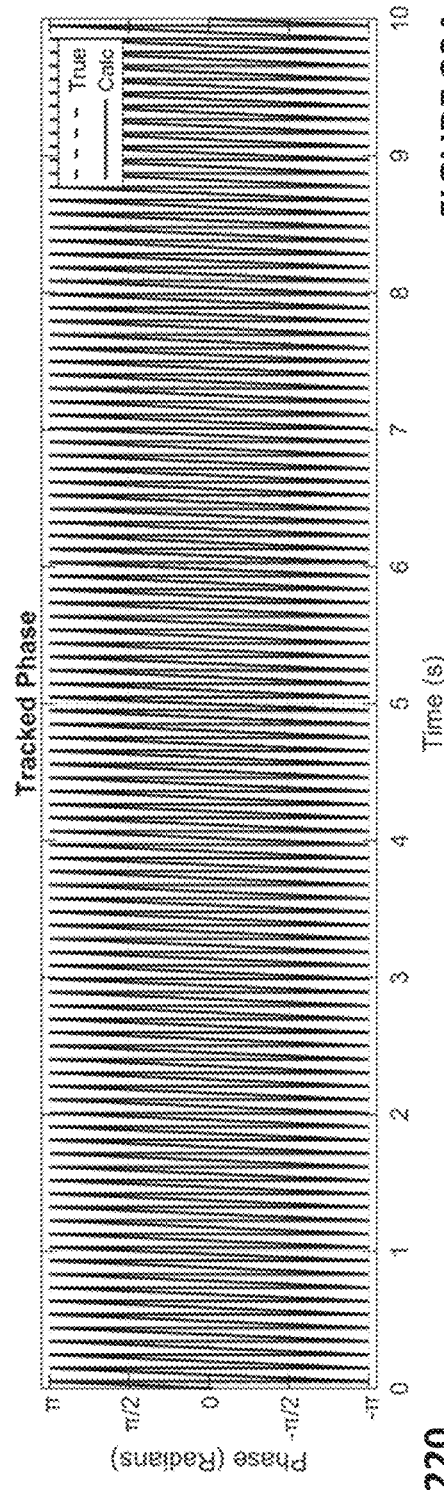
FIG. 22A is an exemplary graph showing the true and RST-tracked phase parameter value for the noisy input signal shown in FIG. 18A. Note that the true value (dashed line) is largely obscured by the tracked value (solid line) as these values largely coincide on the scale of the graph shown.
Figure 22B:
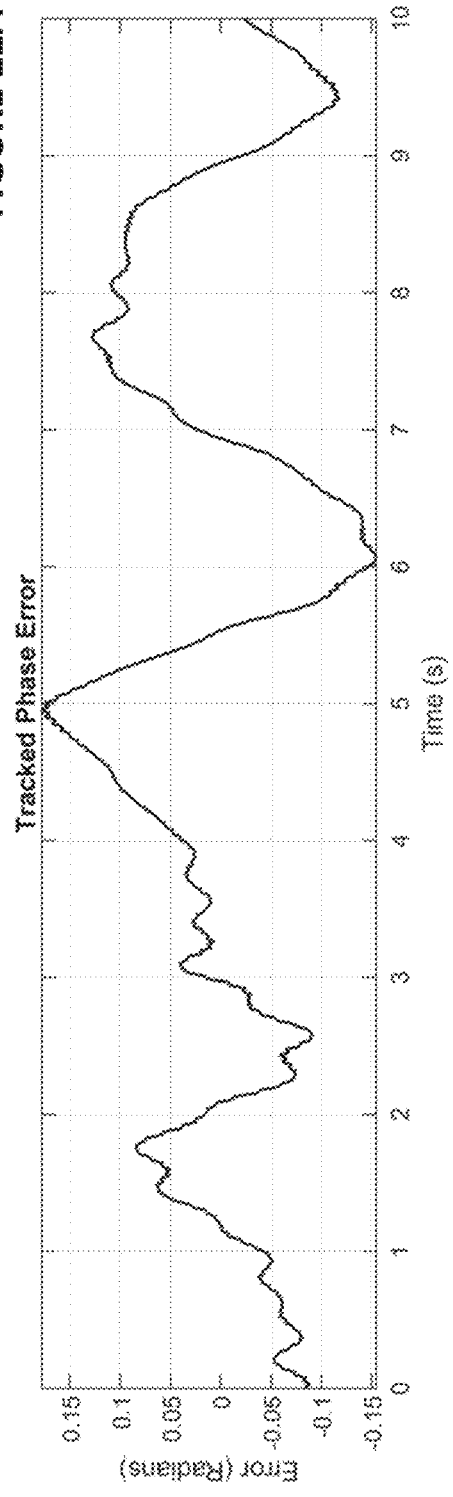
FIG. 22B is an exemplary graph showing the error in the RST-tracked phase value shown in FIG. 22A, on a linear scale.

FIG. 22A (graph 220) shows the phase output of the RST 172, which remains close to the true signal phase as it cycles around ±π radians. FIG. 22B (graph 222) shows the error in the RST 172 phase output, which in the time series shown remains within ±0.15 radians. The phase error also varies slowly with time, reflecting the dynamic characteristic of the pre-filter 179.

Figure 23A:
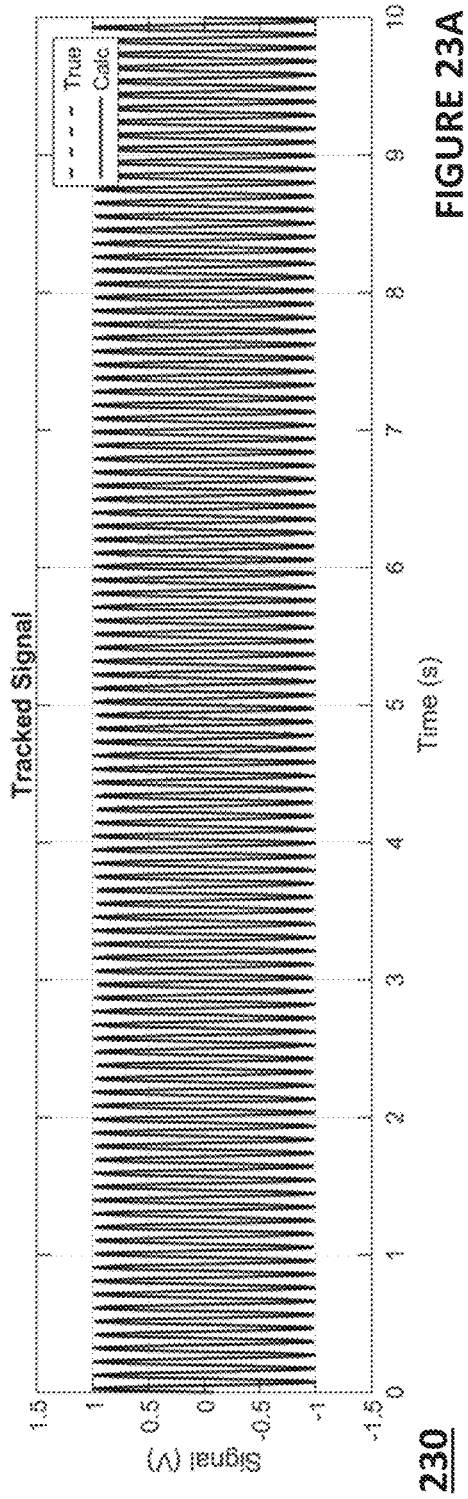
FIG. 23A is an exemplary graph showing the noise-free signal and the RST-tracked signal for the noisy input signal shown in FIG. 18A. Note that the true value (dashed line) is largely obscured by the tracked value (solid line) as these values largely coincide on the scale of the graph shown.
Figure 23B:
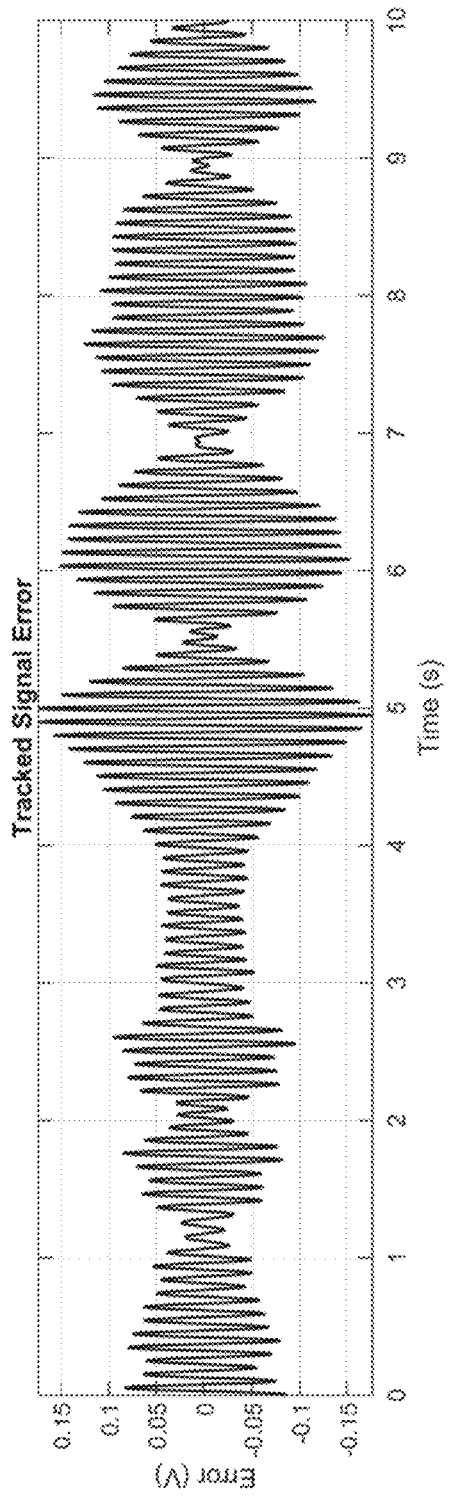
FIG. 23B is an exemplary graph showing the error in the RST-tracked signal shown in FIG. 23A, on a linear scale.

FIG. 23A (graph 230) shows the tracked signal output of the RST 172 (i.e. $\hat{A} \sin(\hat{\phi})$, where $\hat{A}$ is the amplitude output of the RST 172 illustrated in FIG. 21A and $\hat{\phi}$ is the estimated phase output of the RST 172 illustrated in FIG. 22A), together with the noise-free original sinusoid to be tracked, which has a fixed amplitude of 1 V. FIG. 23B (graph 232) shows the error in the RST 172 signal output, which has a maximum value of approximately 0.15 V. The signal errors have a broadly sinusoidal characteristic, reflecting the slow variation in amplitude and phase errors shown in FIGS. 21B and 22B.

Figure 24A:
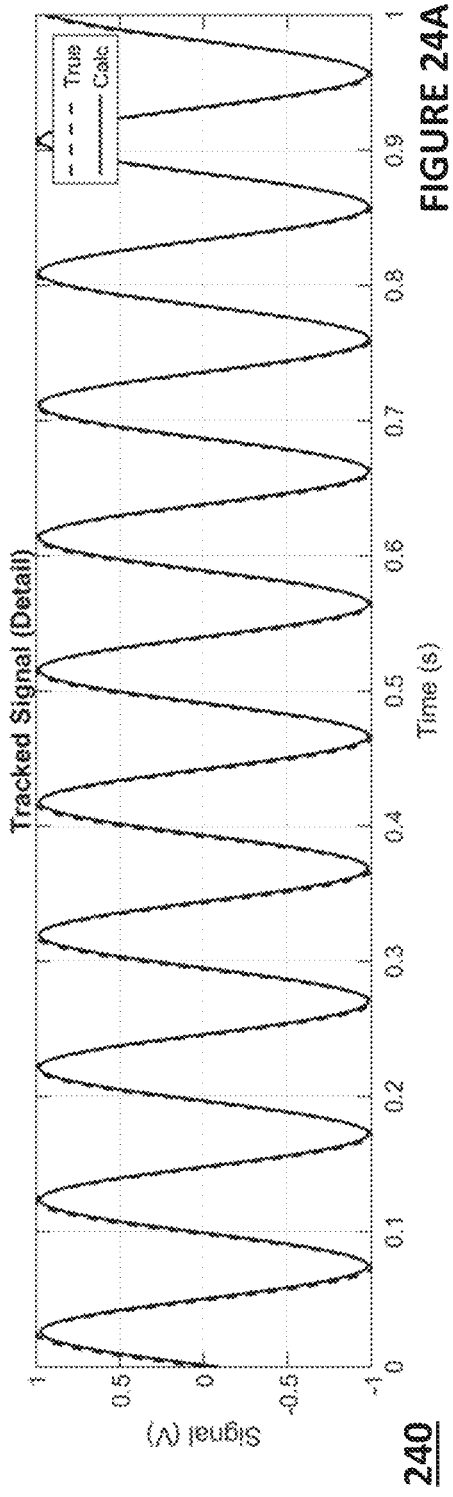
FIG. 24A is an exemplary graph showing the noise-free signal and the RST-tracked signal for the noisy input signal shown in FIG. 18A, on a detailed timescale.
Figure 24B:
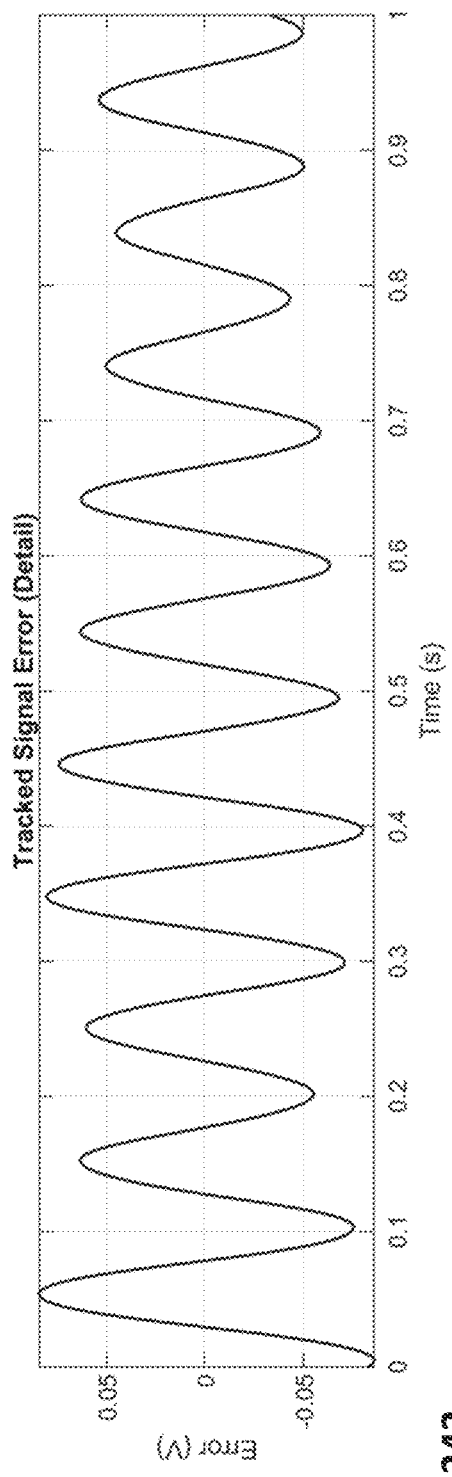
FIG. 24B is an exemplary graph showing the error in the RST-tracked signal shown in FIG. 24A, on a linear scale.

FIGS. 24A (graph 240) and 24B (graph 242) show the same data as FIGS. 23A and 23B but on a reduced timescale. The true and tracked signals can be separately distinguished in FIG. 24A, while the sinusoidal-like variation in the tracked signal error is shown in FIG. 24B.

Overall, this example demonstrates that a Prism-based bandpass filter may enable an RST to track a signal with an unfiltered SNR ratio of −20 dB.

General Examples

Finally, a set of scenarios for sensor signal processing requirements are described, starting from the simplest and adding increased sophistication at each step, in which exemplary Prism-based instantiations are proposed, in order to demonstrate the suitability of Prism-based solutions for a wide range of signal processing requirements e.g. for the new sensor types required for the Internet of Things.

A brief summary of the advantageous properties of the Prism and its associated signal processing blocks is provided below:
1) The Prism is a recursive FIR calculation: the computational burden of calculating one or two Prism outputs is generally low and generally constant, irrespective of the length of the Prism windows.
2) Prism design is essentially trivial:
   A) There are only a few design parameters for a Prism (principally m, where the window length fs/m is constrained to be an integer, and the harmonic number h, also an integer) and so design choice is limited, and therefore simple;
   B) Once the design parameters are determined, the required coefficients are readily calculated as equally-spaced sine and cosine values.
   Accordingly, even a low power sensor system can design and instantiate new Prisms as required, for example in response to the properties of signal being tracked which may vary over time.
3) The Prism-based Trackers such as the Recursive Signal Tracker (RST) generate accurate estimates of sinusoid parameter close to the Cramèr-Rao Lower Bounds.

Prism-based pre-filtering, for example low-pass, bandpass and notch filtering, may be used to reduce the influence of noise and undesired frequency components. Such pre-filtering may be instantiated in real-time in response to observed and/or changing signal conditions.

The signal processing inside a sensor can respond adaptively to changing conditions by the instantiation of new Prism objects that better suit the current operating environment and performance requirements.

Based on these advantageous Prism properties, it is possible to envisage a wide range of applications, from the simplest low power sensor through to high powered, sophisticated devices. Exemplary (but not exclusive) scenarios include the following. Note that although different sinusoidal trackers might be deployed, in the examples given the RST is used throughout.
1) A low power sensor harvests energy from its local environment, with sufficient energy storage capacity to perform a single measurement cycle, assuming infrequent ad-hoc polling. On being polled for data (for example via radio frequency identification—RFID), the sensor collects sufficient data samples to fill the integrals of a short RST, performs a single measurement calculation, and reports the results.
2) The low power sensor records, when powering down, a recommended value of m for its next measurement, based on the current value of the frequency, for example, in order to achieve a value of r close to 0.5 on the next measurement calculation.
3) The sensor has sufficient power to collects data samples regularly and updates the RST's Prism each sample. On being polled, it calculates frequency, amplitude and phase values for reporting.
4) The sensor has a secure power supply and reasonable computational resources. It performs RST measurements every sample, and reports the latest value upon request.
5) A Prism or Prism chain is used as a pre-filter to the RST to reduce noise and improve measurement accuracy.
6) Self-optimization is introduced. In addition to a static, 'background' RST, a 'tracking' RST is deployed. It is instantiated with the value of m selected to provide optimal measurement performance. If, say, r falls outside the range [0.4, 0.6] a new RST is instantiated with a new value of m and the previous tracker RST is deleted. Similar adaptation may be applied to any pre-filtering in use.
7) Three tracking RSTs are deployed. These have values of m near to, above and below the currently optimal value of m (typically 2*f where f is the currently observed sinusoid frequency of the input signal), thus broadening the band of optimal measurement performance. Old RSTs (with their associated pre-filtering) are replaced by better positioned RSTs as the input signal frequency changes over time.
8) Multiple RSTs are used to track the sensor signal, including some with high m values, to enable faster tracking of any change in signal parameter values (as the dynamic response associated with parameter change is a function of 1/m). Simple rules (for example based on the observed rate of change of sinusoidal parameters) are used to determine a 'best' estimate of each sinusoid parameter from the RST outputs, which may be based on some weighted combination of the estimates from more than one RST.
9) Generic sensor diagnostics are introduced. A residual signal is calculated by subtracting the best estimate of the signal (i.e. $A_t \sin(\phi t)$, where $A_t$ and $\phi t$ denote the amplitude and phase, respectively, at time t) from the raw data. Alternatively, dynamic notch filtering could be applied to remove the tracked signal component and leave the residual signal. The SNR is estimated from the residual signal, for example by calculating a moving window estimate of its standard deviation, from which a simple estimate of the measurement uncertainty can be derived.
10) The residual signal and or the sinusoidal parameter estimates are subject to further analysis for example via further RST tracking to detect any harmonics or beat frequencies which may be characteristic of sensor faults (e.g. additional modes of vibration). When additional frequency components are detected, suitable Prism/RST signal processing networks may be instantiated to track the new components and/or to remove their influence on the previously tracked signal components for example using dynamic notch filtering. Diagnostic algorithms are introduced to examine the residual analysis for evidence of known fault modes.
11) Process diagnostics are introduced. The sensor accepts requests from other system components to apply one or more RSTs (with Prism pre-filtering and/or dynamic notch filtering as required) to detect arbitrary frequency components for process diagnostics.
12) An FFT procedure is included. A complete analysis of the sensor signal is performed by a dynamic and recursive process of building Prism chain/RST/dynamic notch filtering blocks and networks to reflect the current structure of the signal. At each stage, the raw sensor signal, or the latest residual, is submitted to the FFT to identify the next largest component. A pre-filter Prism/RST chain is constructed to track the new component. If significant change occurs in the signal structure this is detected and the Prism networks are rebuilt as required. The current set of signal components and values are made available to sensors and other devices in the system.

This list of scenarios is not intended to be prescriptive, but rather simply to illustrate the ways in which the Prism might be deployed in increasingly complex ways to solve sensor signal processing requirements by autonomic sensors.

Note also that while these techniques have been developed primarily with real-time signal processing, many of them are also applicable to off-line analysis of signals.

The invention claimed is:

1. A method of sensing, the method comprising:
obtaining, using a sensor, a first signal representing a physical property of an entity; and
filtering the first signal using a filter to obtain at least one final output signal, wherein the filter is operable to:
pass the first signal representing a physical process through two or more integration paths, one of the integration paths including a sequence of two or more integration stage blocks; and
calculate the at least one final output signal based on an arithmetical combination of outputs of the two or more integration paths,
wherein each of the first signal and the at least one final output signal comprises a sequence of samples, each sample representing a value of the first signal or the at least one final output signal at a sampling time,
wherein an integration stage block in the sequence of integration stage blocks:
receives an input signal comprising a sequence of input samples and generates an output signal comprising a sequence of output samples;
comprises a data window having an associated length in samples, the data window covering a sequence of most recent input samples received by the integration stage block, only the sequence of the most recent input samples influencing a corresponding output sample in the sequence of output samples generated by the integration stage block;
multiplies a newly received input sample by a coefficient to generate a corresponding product value, the product value remaining unchanged while the data window covers the input sample; and
calculates, at or after the sampling time, the corresponding output sample through a numerical integration over product values corresponding to the most recent input samples covered by the data window,
wherein each of the two or more integration stage blocks comprises a same data window length,
wherein the output signal of a preceding block in the sequence of integration stage blocks forms the input signal to a next block in the sequence of integration stage blocks; and
wherein the sensor is or is part of a Coriolis meter, an ultrasonic meter, a pressure sensor, or an electrical power monitoring system.

2. The method of claim 1, wherein a sequence of coefficients for the integration stage block comprises a recurring sequence of linearly spaced sinusoidal values, the recurring sequence corresponding to a whole number of sinusoid periods and being equal in length to the data window.

3. The method of claim 2, wherein the integration stage block comprises a first sequence of linearly spaced sine coefficients or a second sequence of linearly spaced cosine coefficients, a coefficient in the second sequence being shifted by π/2 radians compared with a corresponding coefficient in the first sequence.

4. The method of claim 3, wherein:
the two or more integration paths comprise two integration paths, a first integration path comprising a sequence of two integration stage blocks each comprising the first sequence of sine coefficients, and a second integration path comprising a sequence of two integration stage blocks each comprising the second sequence of cosine coefficients, and wherein said calculating the at least one final output signal is based on a sum of outputs of the two integration paths, or
the two or more integration paths comprise two integration paths, a first integration path comprising a sequence of two integration stage blocks, a first block comprising the first sequence of sine coefficients and a second block comprising the second sequence of cosine coefficients, and a second integration path comprising a sequence of two integration stage blocks, a first block comprising the second sequence of cosine coefficients and a second block comprising the first sequence of sine coefficients, and wherein said calculating the at least one final output signal is based on a difference of outputs of the two integration paths.

5. The method of claim 3, wherein the two or more integration paths comprise four integration paths and the at least one final output signal comprises two final output signals, a first integration path comprising a sequence of two integration stage blocks each comprising the first sequence of sine coefficients, a second integration path comprising a sequence of two integration stage blocks each comprising the second sequence of cosine coefficients, and said calculating the at least one final output signal comprising calculating a first final output signal based on a sum of outputs of the first and the second integration paths; a third integration path comprising a sequence of two integration stage blocks, a first block comprising the first sequence of sine coefficients and a second block comprising the second sequence of cosine coefficients, and a fourth integration path comprising a sequence of two integration stage blocks, a first block comprising the second sequence of cosine coefficients and a second block comprising the first sequence of sine coefficients, and said calculating the at least one final output signal comprising calculating a second final output signal based on a difference of outputs of the third and the fourth integration paths.

6. The method of claim 1, wherein the numerical integration comprises Romberg Integration.

7. The method of claim 1, wherein the numerical integration in the integration stage block comprises deriving a result from a current sequence of the input samples covered by the data window from a value derived from a previous sequence of the input samples covered by the data window, said deriving the result comprising removing an influence of an oldest input sample in the previous sequence of the input samples covered by the data window and including an influence of a newest input sample in the current sequence of the input samples covered by the data window.

8. The method of claim 1, further comprising calculating an estimate of a frequency of a sinusoid component of the first signal, an amplitude of the sinusoid component of the first signal, a phase of the sinusoid component of the first signal, or a combination thereof.

9. The method of claim 1, further comprising estimating a parameter of a signal embedded in the first signal.

10. The method of claim 1, wherein the first signal is generated by a sensor associated with Internet of Things.

11. A sensor system that operates to:
obtain, by sensing, a first signal representing a physical property of an entity;
pass the first signal through two or more integration paths, one of the integration paths including a sequence of two or more integration stage blocks;

calculate at least one final output signal based on an arithmetical combination of outputs of the two or more integration paths; and output the at least one final output signal, wherein each of the first signal and the at least one final output signal comprises a sequence of samples, each sample representing a value of the first signal or the at least one final output signal at a sampling time, wherein an integration stage block in the sequence of integration stage blocks:

receives an input signal comprising a sequence of input samples and generates an output signal comprising a sequence of output samples;

comprises a data window having an associated length in samples, the data window covering a sequence of most recent input samples received by the integration stage block, only the sequence of the most recent input samples influencing a corresponding output sample in the sequence of output samples generated by the integration stage block;

multiplies a newly received input sample by a coefficient to generate a corresponding product value, the product value remaining unchanged while the data window covers the input sample; and calculates, at or after the sampling time, the corresponding output sample through a numerical integration over product values corresponding to the most recent input samples covered by the data window, wherein each of the two or more integration stage blocks comprises a same data window length, and wherein the output signal of a preceding block in the sequence of integration stage blocks forms the input signal to a next block in the sequence of integration stage blocks; and wherein the sensor system is or comprises a Coriolis meter, an ultrasonic meter, a pressure sensor, or an electrical power monitoring system.

12. The sensor system of claim 11, wherein a sequence of coefficients for the integration stage block comprises a recurring sequence of linearly spaced sinusoidal values, the recurring sequence corresponding to a whole number of sinusoid periods and being equal in length to the data window.

13. The sensor system of claim 12, wherein the integration stage block comprises a first sequence of linearly spaced sine coefficients or a second sequence of linearly spaced cosine coefficients, a coefficient in the second sequence being shifted by $\pi/2$ radians compared with a corresponding coefficient in the first sequence.

14. The sensor system of claim 13, wherein:

the two or more integration paths comprise two integration paths, a first integration path comprising a sequence of two integration stage blocks each comprising the first sequence of sine coefficients, and a second integration path comprising a sequence of two integration stage blocks each comprising the second sequence of cosine coefficients, and wherein the filter calculates the at least one final output signal based on a sum of outputs of the two integration paths, or the two or more integration paths comprise two integration paths, a first integration path comprising a sequence of two integration stage blocks, a first block comprising the first sequence of sine coefficients and a second block comprising the second sequence of cosine coefficients, and a second integration path comprising a sequence of two integration stage blocks, a first block comprising the second sequence of cosine coefficients and a second block comprising the first sequence of sine coefficients, and wherein the filter calculates the at least one final output signal based on a difference of outputs of the two integration paths.

15. The sensor system of claim 13, wherein the two or more integration paths comprise four integration paths and the at least one final output signal comprises two final output signals, a first integration path comprising a sequence of two integration stage blocks each comprising the first sequence of sine coefficients, a second integration path comprising a sequence of two integration stage blocks each comprising the second sequence of cosine coefficients, and the filter calculates the at least one final output signal via calculating a first final output signal based on a sum of outputs of the first and the second integration paths; a third integration path comprising a sequence of two integration stage blocks, a first block comprising the first sequence of sine coefficients and a second block comprising the second sequence of cosine coefficients, and a fourth integration path comprising a sequence of two integration stage blocks, a first block comprising the second sequence of cosine coefficients and a second block comprising the first sequence of sine coefficients, and the filter calculates the at least one final output signal via calculating a second final output signal based on a difference of outputs of the third and the fourth integration paths.

16. The sensor system of claim 11, wherein the numerical integration comprises Romberg Integration.

17. The sensor system of claim 11, wherein the numerical integration in the integration stage block comprises deriving a result from a current sequence of the input samples covered by the data window from a value derived from a previous sequence of the input samples covered by the data window, said deriving the result comprising removing an influence of an oldest input sample in the previous sequence of the input samples covered by the data window and including an influence of a newest input sample in the current sequence of the input samples covered by the data window.

18. The sensor system of claim 11, further comprising:

a signal tracker that operates to receive the at least one final output signal and calculate an estimate of a frequency of a sinusoid component of the first signal, an amplitude of the sinusoid component of the first signal, a phase of the sinusoid component of the first signal, or a combination thereof, or a signal tracker that operates to receive the at least one final output signal and to estimate a parameter of a signal embedded in the first signal.

19. The sensor system of claim 11, wherein the first signal received by the filter is generated by a sensor associated with Internet of Things.

* * * * *